(12) United States Patent
Yu et al.

(10) Patent No.: US 12,261,088 B2
(45) Date of Patent: Mar. 25, 2025

(54) PACKAGE STRUCTURE AND METHOD OF FORMING THE SAME

(71) Applicant: Taiwan Semiconductor Manufacturing Company, Ltd., Hsinchu (TW)

(72) Inventors: Jen-Jui Yu, Taipei (TW); Hao-Jan Pei, Hsinchu (TW); Cheng-Ting Chen, Taichung (TW); Chih-Chiang Tsao, Taoyuan (TW); Hsiu-Jen Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 307 days.

(21) Appl. No.: 17/462,023

(22) Filed: Aug. 31, 2021

(65) Prior Publication Data

US 2023/0067313 A1  Mar. 2, 2023

(51) Int. Cl.

| | |
|---|---|
| *H01L 23/31* | (2006.01) |
| *H01L 21/56* | (2006.01) |
| *H01L 23/02* | (2006.01) |
| *H01L 23/485* | (2006.01) |
| *H01L 25/16* | (2023.01) |

(52) U.S. Cl.
CPC ............ *H01L 23/02* (2013.01); *H01L 21/568* (2013.01); *H01L 23/3171* (2013.01); *H01L 23/3185* (2013.01); *H01L 23/485* (2013.01); *H01L 25/16* (2013.01)

(58) Field of Classification Search
CPC . H01L 23/02; H01L 23/3171; H01L 23/3185; H01L 23/485; H01L 25/16
See application file for complete search history.

(56) References Cited

U.S. PATENT DOCUMENTS

| | | | |
|---|---|---|---|
| 8,269,300 B2 * | 9/2012 | Chien | ............... H01L 27/14618 |
| | | | 257/434 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,470,652 B1 * | 10/2016 | Hooper | ................... H01L 21/00 |
| 9,496,189 B2 | 11/2016 | Yu et al. | |
| 9,666,502 B2 | 5/2017 | Chen et al. | |

(Continued)

*Primary Examiner* — Eugene Lee
(74) *Attorney, Agent, or Firm* — JCIPRNET

(57) ABSTRACT

A package structure includes a die, an encapsulation layer, a redistribution layer structure and an adhesive material. The die includes a semiconductor substrate, conductive pads disposed over the semiconductor substrate and a passivation layer disposed over the semiconductor substrate and around the conductive pads. The encapsulation layer laterally encapsulates the die. the redistribution layer structure is disposed on the die and the encapsulation layer, and includes at least one redistribution layer embedded in at least one polymer layer, and the polymer layer contacts a portion of the passivation layer. The adhesive material is disposed on the die and covers an interface between the polymer layer and the passivation layer.

20 Claims, 25 Drawing Sheets

(56) References Cited

U.S. PATENT DOCUMENTS

| | | | |
|---|---|---|---|
| 9,735,131 B2 | 8/2017 | Su et al. | |
| 10,510,673 B2 * | 12/2019 | Hu | H01L 21/565 |
| 10,515,922 B2 * | 12/2019 | Chen | H01L 24/24 |
| 10,522,470 B1 * | 12/2019 | Chang | H01L 21/6835 |
| 11,289,396 B2 * | 3/2022 | Chu | H01L 21/56 |
| 2009/0051052 A1 * | 2/2009 | Yoshioka | G01N 27/128 |
| | | | 257/E23.117 |
| 2013/0032388 A1 * | 2/2013 | Lin | H01L 23/3121 |
| | | | 29/829 |
| 2014/0185264 A1 * | 7/2014 | Chen | H01L 23/3128 |
| | | | 361/814 |
| 2017/0236724 A1 * | 8/2017 | Chang | H01L 23/5381 |
| | | | 438/15 |
| 2019/0115271 A1 * | 4/2019 | Chiang | G06V 40/1306 |
| 2019/0157208 A1 * | 5/2019 | Lin | H01L 24/82 |
| 2019/0371734 A1 * | 12/2019 | Chang | H01L 24/83 |
| 2020/0043822 A1 * | 2/2020 | Sakamoto | H01L 24/85 |
| 2020/0105638 A1 * | 4/2020 | Chiang | H01L 21/561 |
| 2020/0294912 A1 * | 9/2020 | Tai | H01L 24/73 |
| 2021/0098328 A1 * | 4/2021 | Chu | H01L 24/82 |
| 2021/0104563 A1 * | 4/2021 | Lin | H01L 27/14678 |

* cited by examiner

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out (InFO) packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
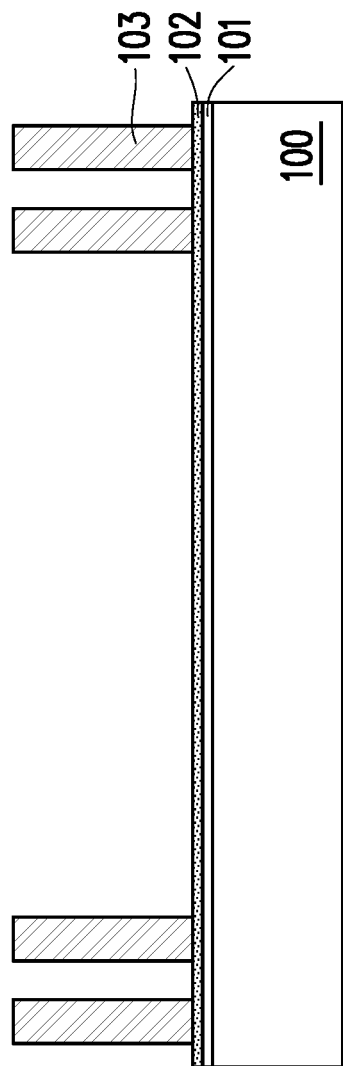
FIGS. 1, 2, 3, 4, 5, 6A, 6B, 7A, 7B, 7C, 8A, 8B, 8C, 8D, 8E, 8F, 9, 10 and 11 illustrate varying views of manufacturing a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1, 2, 3, 4, 5, 6A, 6B, 7A, 7B, 7C, 8A, 8B, 8C, 8D, 8E, 8F, 9, 10 and 11 illustrate varying views of manufacturing a package structure in accordance with some embodiments of the disclosure.

Referring to FIG. 1, a carrier 100 is provided. The carrier 100 may be a glass carrier, a ceramic carrier, or the like. In some embodiments, the carrier 100 has a de-bonding layer 101 formed thereon. The de-bonding layer 101 is formed by, for example, a spin coating method. In some embodiments, the de-bonding layer 101 may be formed of an adhesive such as an Ultra-Violet (UV) glue, a Light-to-Heat Conversion (LTHC) glue, the like, or other types of adhesives. The de-bonding layer 101 is decomposable under the heat of light to thereby release the carrier 100 from the overlying structures that will be formed in subsequent processes.

A dielectric layer 102 is formed on the de-bonding layer 101 over the carrier 100. In some embodiments, the dielectric layer 102 includes silicon oxide, or TEOS, while other dielectric material such as silicon carbide, silicon oxynitride, silicon oxy-carbo-nitride, PSG, BSG, BPSG, or the like may also be used. The dielectric layer 102 may be formed by a deposition process, a spin-on coating process, or the like. In other embodiments, the dielectric layer 102 includes a molding compound, a molding underfill, a resin such as epoxy, or the like, and may be formed by a molding process. In other embodiments, the dielectric layer 102 includes a polymer material, such as polybenzoxazole (PBO), polyimide (PI), benzocyclobutene (BCB), or the like, and may be formed by a deposition process, a lamination process, a spin-on coating process, or the like.

Still referring to FIG. 1, conductive vias 103 are formed on the dielectric layer 102. The conductive vias 103 may be referred to as "through integrated fan-out vias (TIVs)" in some examples. The conductive vias 103 include copper, titanium, nickel, solder, an alloy thereof, the like, or a combination thereof. In some embodiments, each of the conductive vias 103 includes a seed layer and a conductive post formed thereon (not individually shown). In some embodiments, the seed layer includes a first metal layer such as a titanium layer and a second metal layer such as a copper layer over the first metal layer. In some embodiments, the conductive post includes copper or other suitable metal.

In some embodiments, the conductive vias 103 may be formed by the following processes: a seed material layer is firstly formed on the dielectric layer 102 by a sputtering process, and a patterned mask layer such as a patterned photoresist is formed on the seed material layer. The patterned mask layer includes openings that expose portions of seed material layer at the locations where the conductive vias 103 are to be formed. The conductive posts are then formed on the seed material layer exposed by the patterned mask layer. The patterned mask layer is stripped, and the portions of the seed material layer not covered by the conductive posts are removed.

Figure 2:
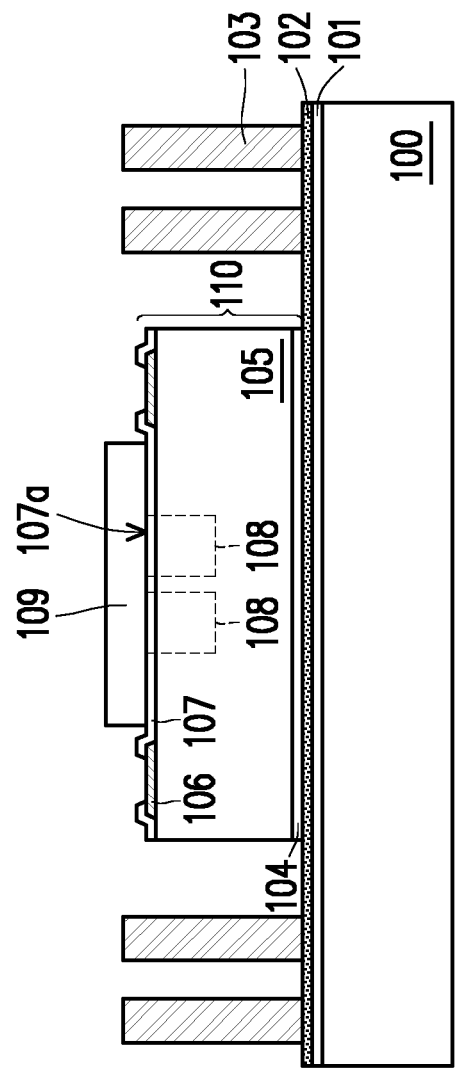

Referring to FIG. 2, a die 110 is mounted to the carrier 100 by a pick and place process, for example. In some embodiments, the die 110 is attached to the dielectric layer 102 through an adhesive layer 104 such as a die attach film (DAF), silver paste, or the like. In some embodiments, the die 110 is one of a plurality of dies cut apart from a wafer, for example. In some embodiments, the die 110 is a logic chip, a sensor chip or an imaging chip, but the disclosure is not limited thereto. In other embodiments, the die 110 may be an application-specific integrated circuit (ASIC) chip, an analog chip, a wireless and radio frequency chip, a voltage regulator chip, a memory chip, or any other suitable type of die. The number of the die 110 shown in FIG. 2 is merely for illustration, and the disclosure is not limited thereto. In some embodiments, multiple dies 110 may be mounted over the carrier 100, and the dies 110 may have the same or different functions.

The die 110 is disposed between the conductive vias 103; that is, the conductive vias 103 are located aside or around the die 110. In some embodiments, the die 110 may include a semiconductor substrate 105, a plurality of conductive pads 106, and a passivation layer 107.

The semiconductor substrate 105 includes an elementary semiconductor such as silicon, germanium and/or a compound semiconductor such as silicon germanium, silicon carbide, gallium arsenic, indium arsenide, gallium nitride or indium phosphide. For example, the semiconductor substrate 105 is a silicon-on-insulator (SOI) substrate or a silicon substrate. In various embodiments, the semiconductor substrate 105 may take the form of a planar substrate, a substrate with multiple fins, nanowires, or other forms known to people having ordinary skill in the art. Depending on the requirements of design, the semiconductor substrate 105 may be a P-type substrate or an N-type substrate and may have doped regions therein. In some embodiments, at least one device (not shown) is formed in and/or on the semiconductor substrate 105. The device may be an integrated active device, an integrated passive device, or a combination thereof. The device may include a transistor, such as fin field effect transistor (FinFET), a gate all around FET (GAA-FET) or the like.

In some embodiments, an interconnection structure (not shown) is formed over the device on the semiconductor substrate 105. The interconnection structure may include conductive features embedded in dielectric layers, so as to electrically connect different components in and/or on the semiconductor substrate 105 to form a functional circuit. In some embodiments, the dielectric layers include an inter-layer dielectric (ILD) layer and one or more inter-metal dielectric (IMD) layers. The conductive features may include multiple layers of conductive lines and conductive plugs (not shown). The conductive plugs include contact plugs and via plugs. The contact plugs are located in the ILD layer to connect the metal lines to the device. The via plugs are located in the IMD layers to connect the metal lines in different layers. The dielectric layers include silicon oxide, silicon nitride, silicon oxynitride, a low-k dielectric material, or a combination thereof. The conductive features include metal, a metal alloy or a combination thereof, such as tungsten (W), copper (Cu), copper alloy, aluminum (Al), aluminum alloy, or a combination thereof.

The conductive pads 106 may be electrically connected to a top conductive feature of the interconnection structure and the underlying device. In some embodiments, the conductive pads 106 are aluminum pads, but the disclosure is not limited to. In other embodiments, the conductive pads 106 may include other metal or metal alloy, such as copper, nickel, or an alloy thereof.

The passivation layer 107 is formed over the semiconductor substrate 105 and partially covers the conductive pads 106. Portions of the conductive pads 106 are exposed by the passivation layer 107 and serve as external connections of the die 110. In some embodiments, the passivation layer 107 includes an insulating material such as silicon oxide, silicon nitride, silicon, silicon carbide, the like, or a combination thereof. However, the disclosure is not limited thereto. In other embodiments, the passivation layer 107 includes a polymer material such as polybenzoxazole (PBO), polyimide (PI), benzocyclobutene (BCB), the like, or a combination thereof.

In some embodiments, the die 110 is a sensor chip and includes a plurality of sensing regions 108. The sensing regions 108 may be pixel regions in some embodiments. The sensing regions 108 may extend from the top surface 107a of the passivation layer 107 to the underlying device. In some embodiments, the sensing regions 108 are disposed between the conductive pads 106. It is noted that, the shape, size and location of the sensing regions 108 shown in the figures are merely for illustration, and the disclosure is not limited thereto.

In the embodiments in which the die 110 is a sensor chip, the die 110 may further include a sacrificial film 109 formed over the semiconductor substrate 105 and covering the sensing regions 108. In some embodiments, the sacrificial film 109 overlays a portion of passivation layer 107 without covering the conductive pads 106. Specifically, the width of the sacrificial film 109 may be less than the width of the die 110, but the disclosure is not limited thereto. In other embodiments, the sacrificial film 109 may further extend to cover the conductive pads 106. For example, the sacrificial film 109 may completely cover the passivation layer 107 and the conductive pads 106. The width of the sacrificial film 109 may be substantially equal to the width of the die 110. In some embodiments, the material of the sacrificial film 109 is different from the materials of the passivation layer 107 and the subsequently formed encapsulation layer. For example, the sacrificial film 109 may include a polymer such as polybenzoxazole (PBO), polyimide (PI), benzocyclobutene (BCB), the like, or a combination thereof, but the disclosure is not limited thereto. In some embodiments, the die 110 is free of a connector (e.g., metal pillar) on the conductive pads 106, but the disclosure is not limited thereto.

Figure 3:
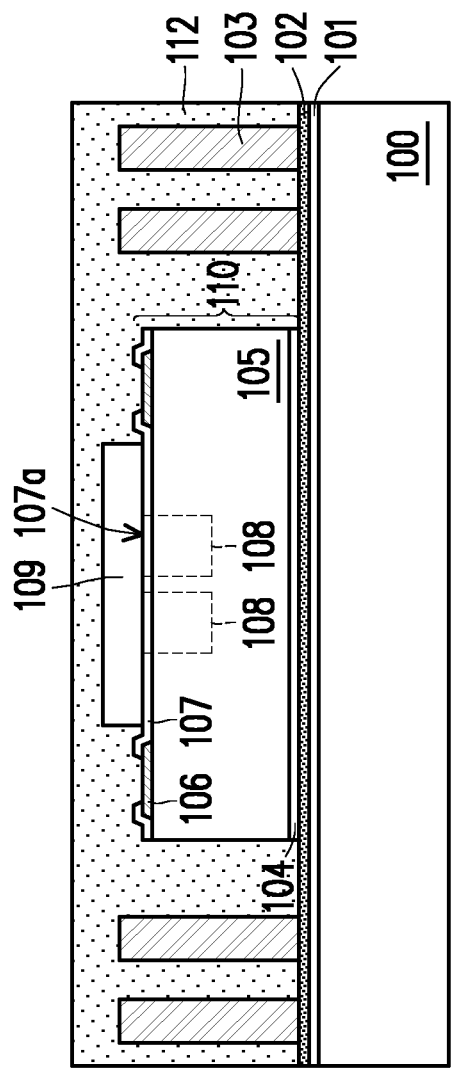

Referring to FIG. 3, an encapsulation material layer 112 is formed over the carrier 100 to encapsulate the die 110 and the conductive vias 103. In some embodiments, the encapsulation material layer 112 includes a molding compound, a molding underfill, a resin such as epoxy, the like, or a combination thereof. In other embodiments, the encapsulation material layer 112 includes a photo-sensitive material such as polybenzoxazole (PBO), polyimide (PI), benzocyclobutene (BCB), the like, or a combination thereof. In other embodiments, the encapsulation material layer 112 includes nitride such as silicon nitride, oxide such as silicon oxide, phosphosilicate glass (PSG), borosilicate glass (BSG), boron-doped phosphosilicate glass (BPSG), the like, or a combination thereof. In some embodiments, the encapsulation material layer 112 includes a molding compound which is a composite material including a base material (such as polymer) and fillers distributed in the base material. Each filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other suitable shape.

In some embodiments, the encapsulation material layer 112 is formed by an over-molding process, such that the encapsulation material layer 112 has a top surface higher than top surfaces of the conductive vias 103 and the die 110. In other words, the encapsulation material layer 112 encapsulates the sidewalls and top surfaces of the die 110 and the conductive vias 103.

Figure 4:
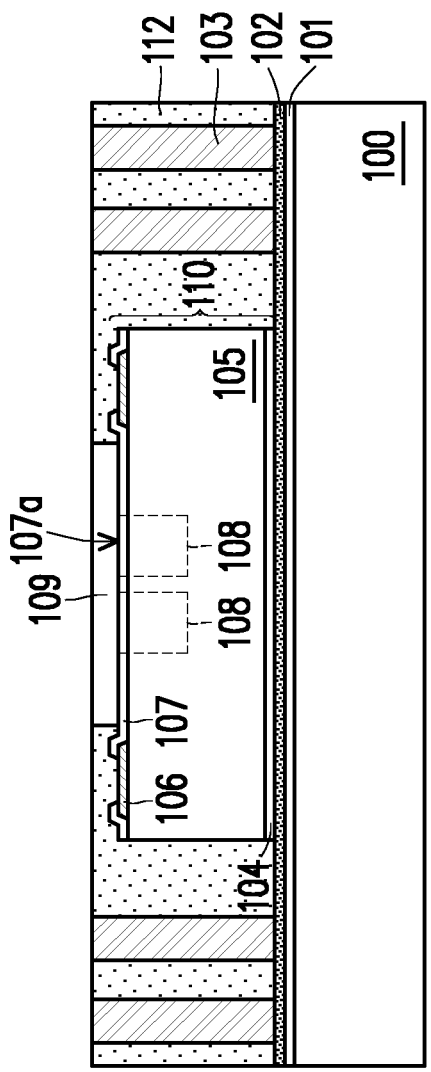
Figure 14:
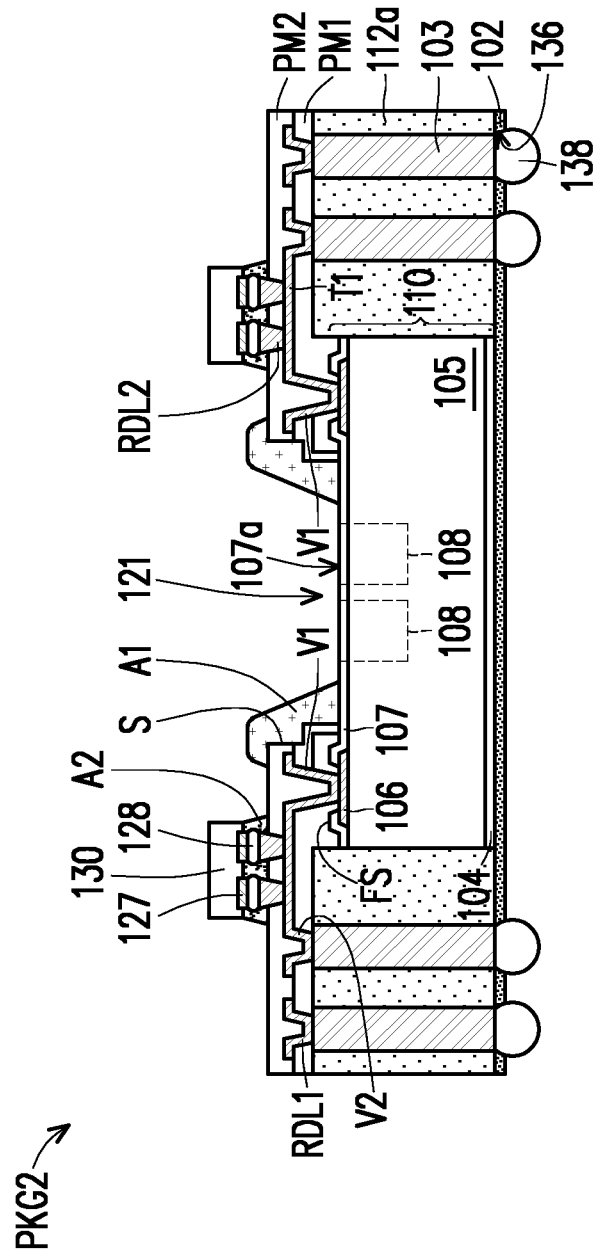
FIG. 14 illustrates a schematic cross-sectional view of a package structure in accordance with other embodiments of the disclosure.

Referring to FIG. 4, a planarization process is performed to remove a portion of the encapsulation material layer 112, and the remaining encapsulation layer 112a exposes the conductive vias 103 and the sacrificial film 109. The planarization process includes a chemical mechanical polishing (CMP) process, for example. In some embodiments, a portion of the sacrificial film 109 and/or portions of the conductive vias 103 may also be removed by the planarization process. After the planarization process is performed, the top surfaces of the encapsulation layer 112a, the conductive vias 103 and the sacrificial film 109 are substantially coplanar with each other. In some embodiments in which the sacrificial layer 109 partially covers the passivation layer 107, a portion of the encapsulation layer 112a is located on the die 110 to encapsulate and physically contact a portion of the passivation layer 107 and portion of the conductive pads 106 uncovered by the sacrificial layer 109. In other embodiments in which the sacrificial layer 109 completely covers the top surfaces of the passivation layer 107 and the conductive pads 106, the encapsulation layer 112a is laterally aside the die 110 (as shown in FIG. 14).

Figure 5:
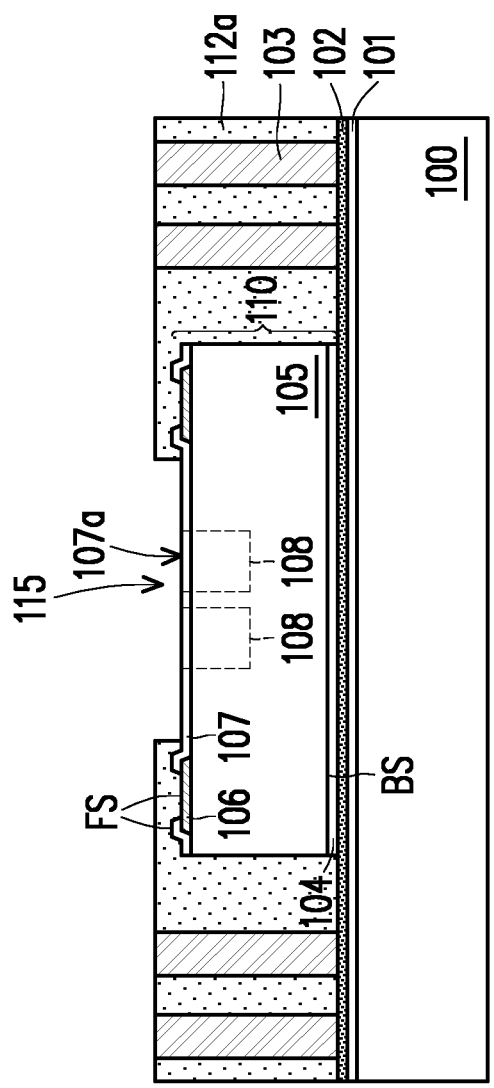

Referring to FIG. 5, the sacrificial film 109 is removed to expose the sensing regions 108 of the die 110. The sacrificial film 109 may be removed by a suitable technique such as an etching process, a laser irradiation process, or the like. The etching process may include a dry etching, a wet etching or a combination thereof.

In some embodiments, after the sacrificial film 109 is removed, a portion of the passivation layer 107 is exposed, while the other portion of the passivation layer 107 and the conductive pads 106 are covered by the encapsulation layer 112. The top surfaces of the passivation layer 107 and the conductive pads 106 constitute the first surface FS of the die 110. The first surface FS is referred to as a front surface, an active surface or a sensing surface of the die 110 in some examples. In some embodiments, the first surface FS of the die 110 is lower than the top surface of the encapsulation layer 112a and the top surfaces of the conductive vias 103, and a portion of the first surface FS of the die 110 is encapsulated by the encapsulation layer 112a. The die 110 has a second surface BS opposite to the first surface FS. The second surface BS is a bottom surface of the semiconductor substrate 105, and may also be referred to as a back surface of the die 110.

Still referring to FIG. 5, a recess 115 is formed at the position previously occupied by the removed sacrificial film 109. The recess 115 is located over the die 110 and within the encapsulation layer 112a, and a portion of the sidewall of the encapsulation layer 112a is exposed by the recess 115. In other words, the recess 115 is defined by a portion of the first surface FS of the die 110 and the sidewall of the encapsulation layer 112a.

Figure 6A:
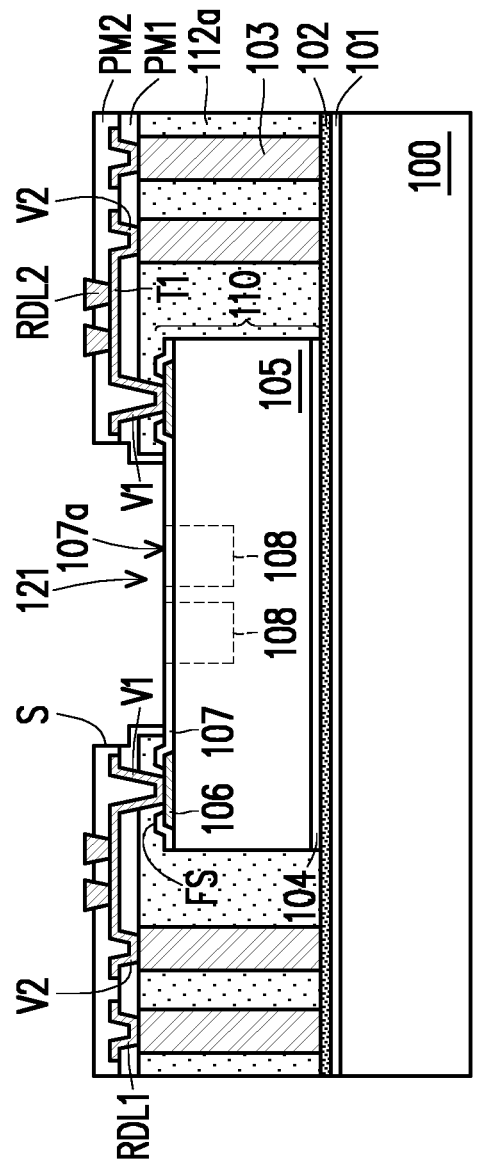
Figure 6B:
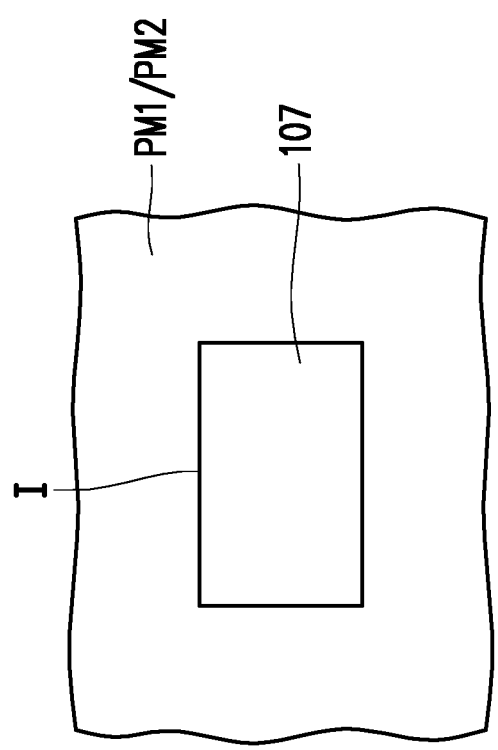

Referring to FIG. 6A and FIG. 6B, a redistribution layer structure 120 is formed on the die 110, the conductive vias 103 and the encapsulation layer 112a, and electrically connected to the die 110 and the conductive vias 103. The sensing regions 108 of the die 110 may be exposed by the redistribution layer structure 120. In some embodiments, the redistribution layer structure 120 is also referred to as a "front-side redistribution layer structure" formed on the front side of the die 110. Herein, the term "front-side" refers to a side close to the conductive pads 106 of the die 110.

In some embodiments, the redistribution layer structure 120 includes polymer layers and redistribution layers alternatively stacked on one another. For example, the redistribution layer structure 120 includes polymer layers PM1, PM2, and redistribution layers RDL1, RDL2. The number of the polymer layers or the redistribution layers shown in FIG. 6A is merely for illustration, and the disclosure is not limited thereto. The redistribution layers are disposed in the polymer layers and electrically connected to each other.

In some embodiments, each polymer layer PM1, PM2 includes polybenzoxazole (PBO), polyimide (PI), benzocyclobutene (BCB), the like, or a combination thereof. The polymer layers PM1, PM2 may be replaced by dielectric layers or insulating layers as needed. In some embodiments, the metal features of each of the redistribution layers RDL1, RDL2 includes metal vias and/or metal lines. The metal vias may be formed between and in contact with two metal lines. Each of the redistribution layers RDL1, RDL2 may include tungsten (W), copper (Cu), a copper alloy, aluminum (Al), an aluminum alloy or a combination thereof. In some embodiments, a barrier layer (not shown) is formed between each metal feature and the adjacent polymer layer to prevent the material of the metal feature from migrating to the neighboring device. The barrier layer may include Ta, TaN, Ti, TiN, CoW or a combination thereof. In some embodiments, a seed layer (not shown) is further formed between each metal feature and the barrier layer. The seed layer may include Cu, Ag or the like.

In some embodiments, the redistribution layer RDL1 penetrates through the polymer layer PM1 and the encapsulation layer 112a to connect to the conductive vias 103 and the conductive pads 106 of the die 110. The redistribution layer RDL2 penetrates through the polymer layer PM2 to connect to redistribution layer RDL1. A portion of the redistribution layer structure 120, such as a portion of the polymer layer PM1 may fill into the recess 115 and covers a portion of the top surface of the passivation layer 107. In some embodiments, the redistribution layer structure 120 has an opening 121 overlapped and in spatial communication with the recess 115, so as to expose the sensing regions 108 of the die 110. The opening 121 may be defined by a portion of front surface FS of the die 110 and the surface (i.e., inner sidewall or inner surface) S of the redistribution layer structure 120. It is noted that, although the redistribution layer structure 120 is shown to have two separate parts on opposite sides of the opening 121 in the cross-sectional view FIG. 6A, the redistribution layer structure 120 is actually a continuous structure. When viewed in a top view, the redistribution layer structure 120 may be a continuous structure with the opening 121 disposed in a center region thereof. As shown in the simplified top view in FIG. 6B, the polymer layers PM1, PM2 of the redistribution layer structure 120 expose a portion of the passivation layer 107.

In some embodiments, the inner surface S of the redistribution layer structure 120 has a stepped profile. In other words, a portion (e.g., edge portion) of the redistribution layer structure 120 is step shaped. The inner surface S may include a first inner sidewall landing on the die 110, a second inner sidewall over the first inner sidewall, and a substantially planar surface connecting the first inner sidewall and the second inner sidewall. The first inner sidewall is laterally shifted from the second inner sidewall and closer to a center of the die 110 than the second inner sidewall in a horizontal direction. The planar surface may be lower than, substantially coplanar with or higher than the top surface of the polymer layer PM1. The first inner sidewall may include at least a portion of an inner sidewall of the polymer layer PM1. The second inner sidewall may include at least a portion of an inner sidewall of the polymer layer PM2. In some embodiments, a portion of the polymer layer PM1 may laterally protrude from the polymer layer PM2 and/or another portion of the polymer layer PM1. However, the disclosure is not limited thereto. In other embodiments, the inner surface S (i.e., inner sidewall) of the redistribution layer structure 120 may be substantially straight or inclined.

In some embodiments, the redistribution layer structure 120 may be formed by the following processes: a first polymer material layer is formed over the carrier 100 to cover die 110 and the encapsulation layer 112a through a suitable technique such as spin coating, chemical vapor deposition (CVD), plasma-enhanced chemical vapor deposition (PECVD), lamination or the like. Thereafter, the redistribution layer RDL1 is formed to penetrate through the first polymer material layer and the encapsulation layer 112a to connect to the conductive vias 103 and the conductive pads 106. The forming method of the redistribution layer RDL1 may include a physical vapor deposition (PVD) such as sputtering process followed by an electroplating process. The formation of the redistribution layer RDL1 may avoid the region directly over the sensing region 108 of the die 110. Thereafter, processes for forming the polymer material layer and redistribution layer are repeated to form a second polymer material layer and the redistribution layer RDL2. The first polymer material layer and/or the second polymer material layer may fill in the recess 115 and overlay the sensing regions 108. In some embodiments, thereafter, the second and first polymer material layers are patterned to form the polymer layers PM1, PM2 having the opening 121, thereby exposing the sensing regions 108. The patterning method may include an exposure and development process, a laser drilling process, the like, or a combination thereof. In other embodiments, the patterning of the polymer material layer may be performed before the formation of the corresponding redistribution layer. In some embodiments, upon the patterning of the second and first polymer material layers, an interface I exists between the polymer layer PM1 and the passivation layer 107. However, the disclosure is not limited thereto. In other embodiments, upon the patterning of the second and first polymer material layers, an interface may exist between the polymer layer PM2 and the passivation layer 107.

In some embodiments, the polymer layer PM1 is disposed on the encapsulation layer 112a and may partially fill into the recess 115 (FIG. 5). The polymer layer PM1 may cover the top surface of the encapsulation layer 112a and a portion of the front surface FS of the die 110. In some embodiments, a portion of the polymer layer PM1 fills into the recess 115 to cover the sidewall (i.e., inner sidewall) of the encapsulation layer 112a. The top corners of the encapsulation layer 112a may be covered by the polymer layer PM1. In some embodiments, the polymer layer PM1 may be not filled in the recess 115, and the inner sidewall of the polymer layer PM1 may be substantially aligned with or laterally shifted from the inner sidewall of the encapsulation layer 112a.

The redistribution layer RDL1 penetrates through the polymer layer PM1 and the encapsulation layer 112a to electrically connect to the conductive pads 106 of the die 110 and the conductive vias 103. In some embodiments, the redistribution layer RDL1 includes vias V1, vias V2 and traces T1 electrically connected to each other. The traces T1 are located on and extending on the top surface of the polymer layer PM1. The vias V1 penetrate through the polymer layer PM1 and the underlying encapsulation layer 112a, so as to connect the traces T1 to the conductive pads 106 of the die 110. The vias V2 penetrate through the polymer layer PM1, so as to connect the traces T1 to the conductive vias 103. The height of the via V1 is larger than the height of the via V2, and the bottom surface of the via V1 is lower than the bottom surface of the via V2. Upper portions of the vias V1 are embedded in polymer layer PM1, while bottom portions of the vias V1 are laterally encapsulated by the encapsulation layer 112a and laterally aside the conductive vias 103.

The polymer layer PM2 is disposed on the polymer layer PM1 to cover the redistribution layer RDL1. In some embodiments, a portion of the polymer layer PM2 may be laterally surrounded by the vias V1 and may have a bottom surface (i.e., the bottommost surface of the polymer layer PM2) lower than a top surface of the encapsulation layer 112a. However, the disclosure is not limited thereto. The bottommost surface of polymer layer PM2 may be higher than or substantially coplanar with the top surface of the encapsulation layer 112a, which is at least partially depending on the configuration of the via V1. In some embodiments, the redistribution layer RDL2 may be a conductive via or conductive pillar protruding from the top surface of the polymer layer PM2 for further electrical connection. The cross-sectional shape of the redistribution layer RDL2 may be inverted trapezoid, square, rectangle, the like, or any other suitable shape.

Figure 7A:
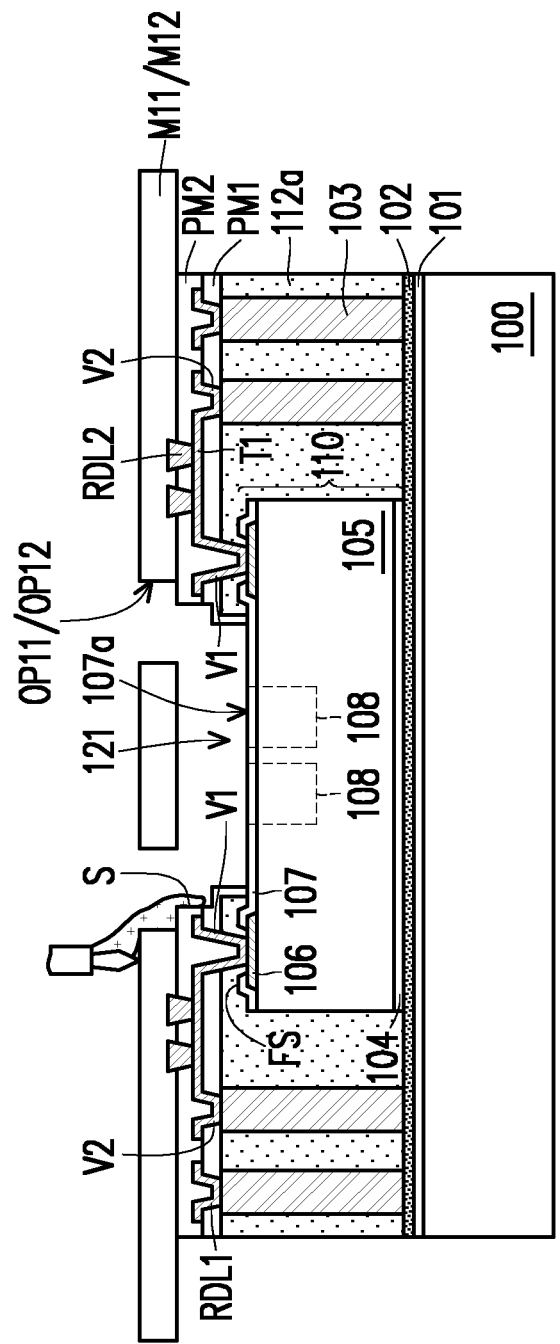
Figure 7C:
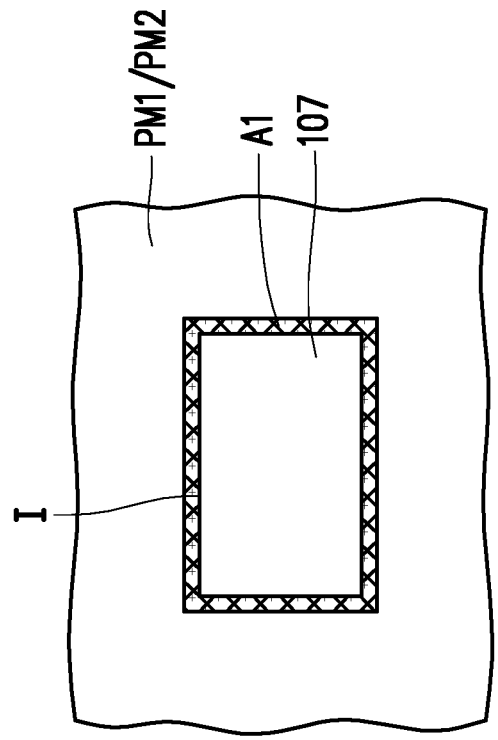
Figure 7B:
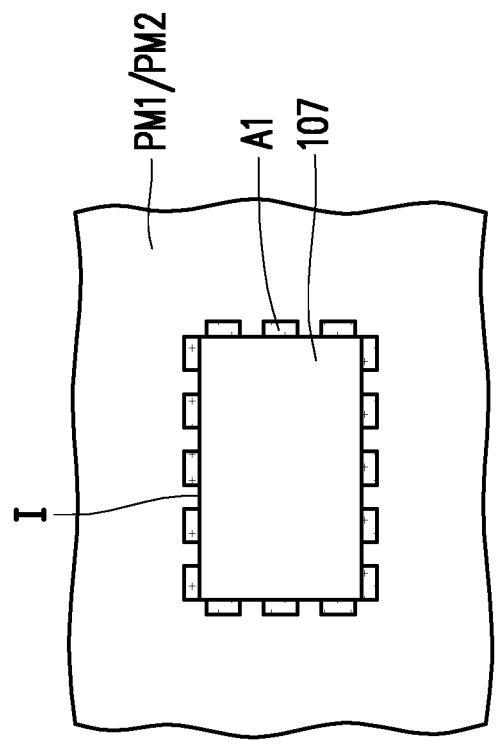

Referring to FIGS. 7A, 7B and 7C, an adhesive material A1 is applied along the interface I between the polymer layer PM1 and the passivation layer 107. Specifically, the adhesive material A1 is formed as a spacer on the sidewall of the opening 121 (e.g., the inner surface S of the Redistribution layer structure 120).

Figure 13:
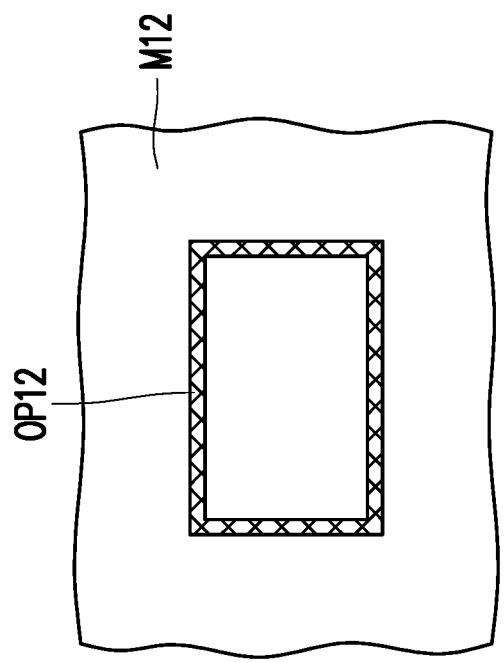
FIG. 12 to FIG. 13 illustrate schematic top views of stencil and screen masks in accordance with some embodiments of the disclosure.
Figure 12:
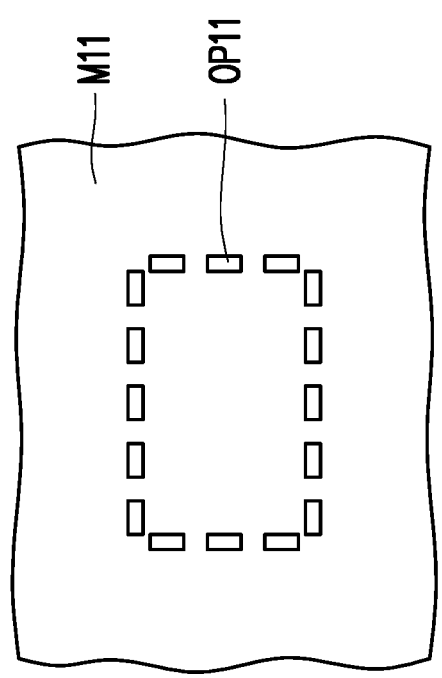

In some embodiments, the adhesive material A1 includes a molding compound, a molding underfill, a resin (e.g., epoxy, silicone or both), or the like. In other embodiments, the adhesive material A1 includes a polymer material, such as polybenzoxazole (PBO), polyimide (PI), benzocyclobutene (BCB), or the like. In some embodiments, the adhesive material A1 is formed by a stencil printing process with a stencil mask M11 (see FIG. 12) with openings OP11 corresponding to a location where the adhesive material A1 is to be printed. In other embodiments, the adhesive material A1 is formed by a screen printing process with a screen mask M12 (see FIG. 13) with openings OP12 corresponding to a location where the adhesive material A1 is to be printed.

The printing process may be formed by the following processes: a stencil or screen mask M11/M12 is placed onto the redistribution layer structure 120. The stencil or screen mask M11/M12 has openings OP11/OP12 that expose the inner surface S of the redistribution layer structure 120 and a portion of the passivation layer 107. The printing process is performed using the stencil or screen mask M11/M12, such that the adhesive material A1 is applied or printed on the inner surface S of the redistribution layer structure 120 and on the exposed portion of the passivation layer 107.

In some embodiments, when a stencil printing process is performed with a stencil mask M11, the adhesive material A1 is formed as separate islands arranged along the interface I between the polymer layer PM1 and the passivation layer 107, as shown in the simplified top view in FIG. 7B. In other embodiments, when a screen printing process is performed with a screen mask M12, the adhesive material A1 is formed as a ring shape with grid patterns along the interface I between the polymer layer PM1 and the passivation layer 107, as shown in the simplified top view in FIG. 7C.

Figure 8A:
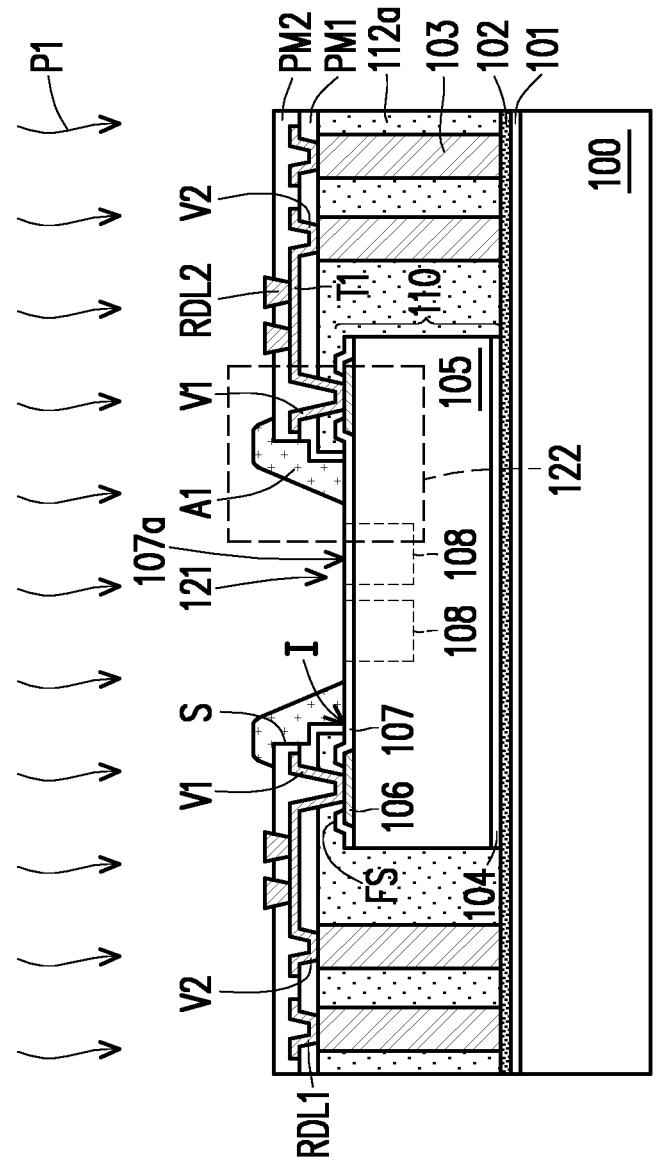
Figure 8B:
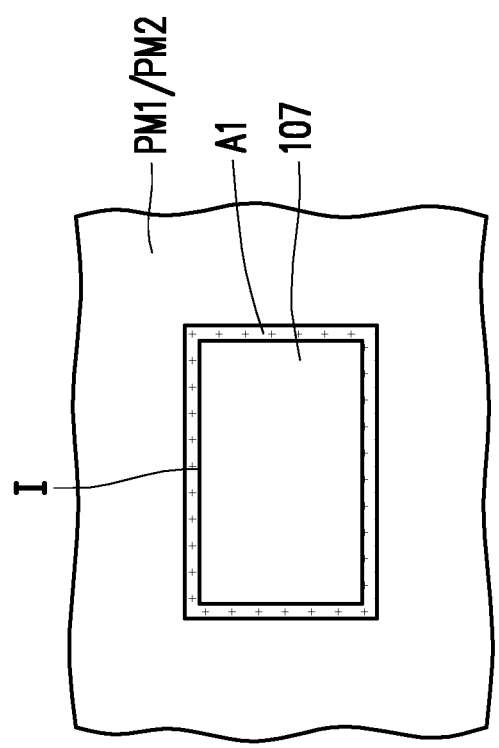

Referring to FIGS. 8A and 8B, after the adhesive printing process, a curing process P1 is performed to the adhesive material A1. In some embodiments, the curing process P1 is performed at a temperature of about 120° C. to 150° C. for about 1 hour to 2 hours. Upon the curing process P1, the adhesive material A1 is formed as an enclosed shape along the interface I between the polymer layer PM1 and the passivation layer 107, as shown in the simplified top view in FIG. 8B. For example, the enclosed shape includes a continuous ring shape such as a rectangular ring shape or a circular ring shape. In some embodiments, the adhesive material A1 is configured to provide sealing protection for the interface between two different materials (e.g., between the polymer layer and the passivation layer), so as to prevent the film delamination issue and therefore improve the reliability of the device. The adhesive material A1 is referred to a "sealing protection structure", "protection sealant" or "interface sealing structure" in some examples.

Each of FIG. 8C to FIG. 8F shows local enlarged views of a region 122 of FIG. 8A in accordance with some embodiments of the disclosure, in which the partial cross-sectional view is shown on the upper side of the figure, and the partial top view is shown on the lower side of the figure.

Figure 8C:
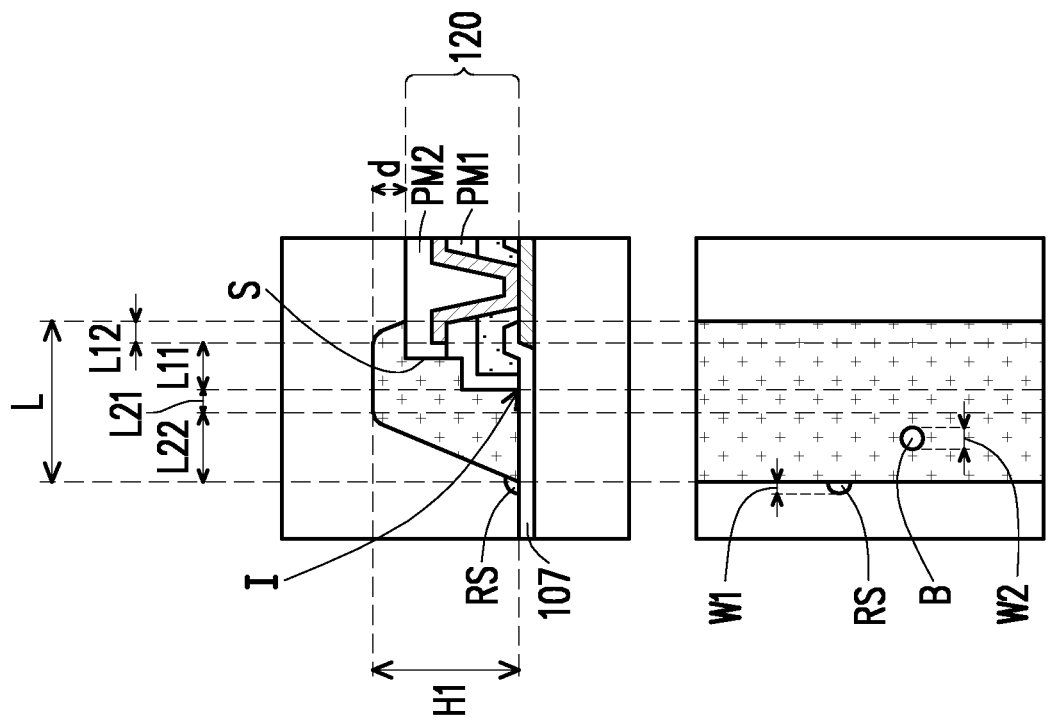

As shown in FIG. 8C, the adhesive material A1 is formed on the sidewall S of the redistribution layer structure 120 and extend onto a portion of the top surface of the redistribution layer structure 120. In some embodiments, the adhesive material A1 has an unsymmetrical sidewall profile. For example, the adhesive material A1 has a stepped sidewall close to the redistribution layer structure 120, an inclined sidewall away from the redistribution layer structure 120, and a mesa connecting the stepped sidewall and the inclined sidewall. Specifically, the adhesive material A1 not only covers the interface I between the polymer layer PM1 and the passivation layer 107, but covers two exposed polymer steps of the redistribution layer structure 120. From another point of view, the adhesive material A1 has a curvy sidewall with multiple turning points close to the redistribution layer structure 120, and a substantially smooth sidewall away from the redistribution layer structure 120.

In some embodiments, as shown in FIG. 8C, the adhesive material A1 has a total width L of about 200-1000 um. In some embodiments, the total width L of the adhesive material A1 is divided into different types: a width L1 on the polymer layer (including an extending width L11 and a bleeding width L12), and a width L2 on the passivation layer (including an extending width L21 and a bleeding width L22). For example, the extending width L11 on the polymer layer PM1/PM2 is about 50-250 um, and the bleeding width L22 on the polymer layer PM2 is about 30-250 um, the extending width L21 on the passivation layer 107 is about 50-250 um, the bleeding width L22 on the passivation layer 107 is about 70-250 um or less. The sensing regions 108 are not covered by the adhesive material A1. Specifically, the adhesive material A1 is separated from the sensing regions 108 by a non-zero horizontal distance. In some embodiments, the distance (e.g., keep out zone) from the edge of the adhesive material A1 to the sensing regions 108 is at least about 50 um or more. In some embodiments, as shown in FIG. 8C, the adhesive material A1 has a total height H1 ranging from about 30 um to 100 um. In some embodiments, the top surface of the adhesive material A1 is higher than the top surface of the redistribution layer structure 120 by a non-zero distance d. For example, the non-zero distance d ranges from about 1 um to 30 um.

Figure 8D:
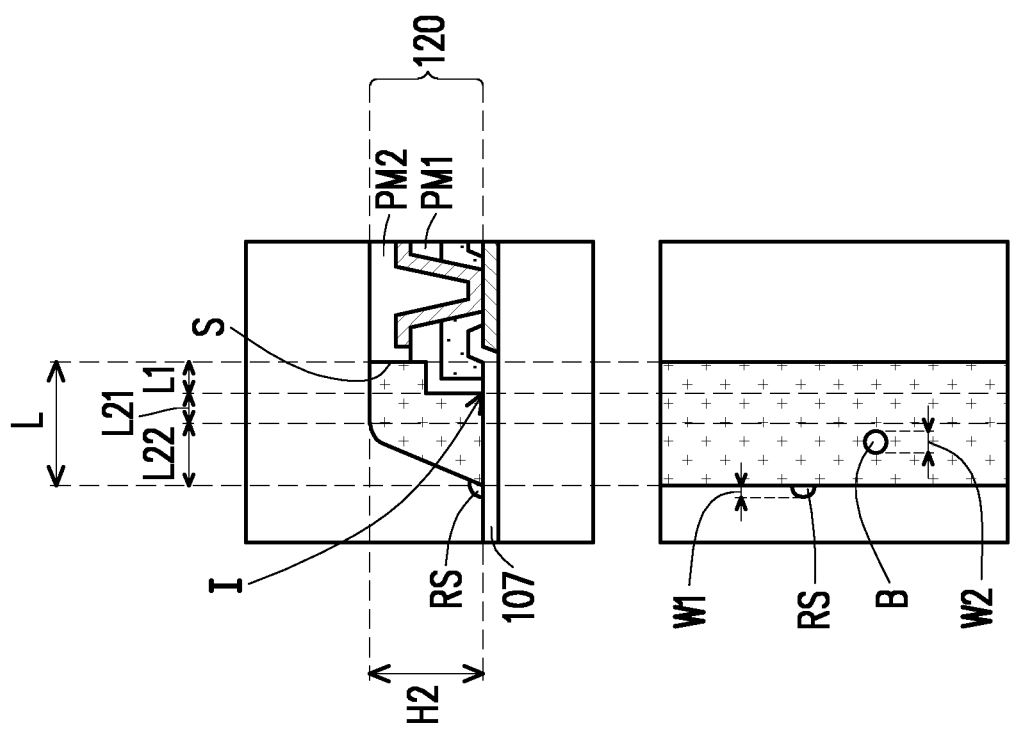
Figure 8E:
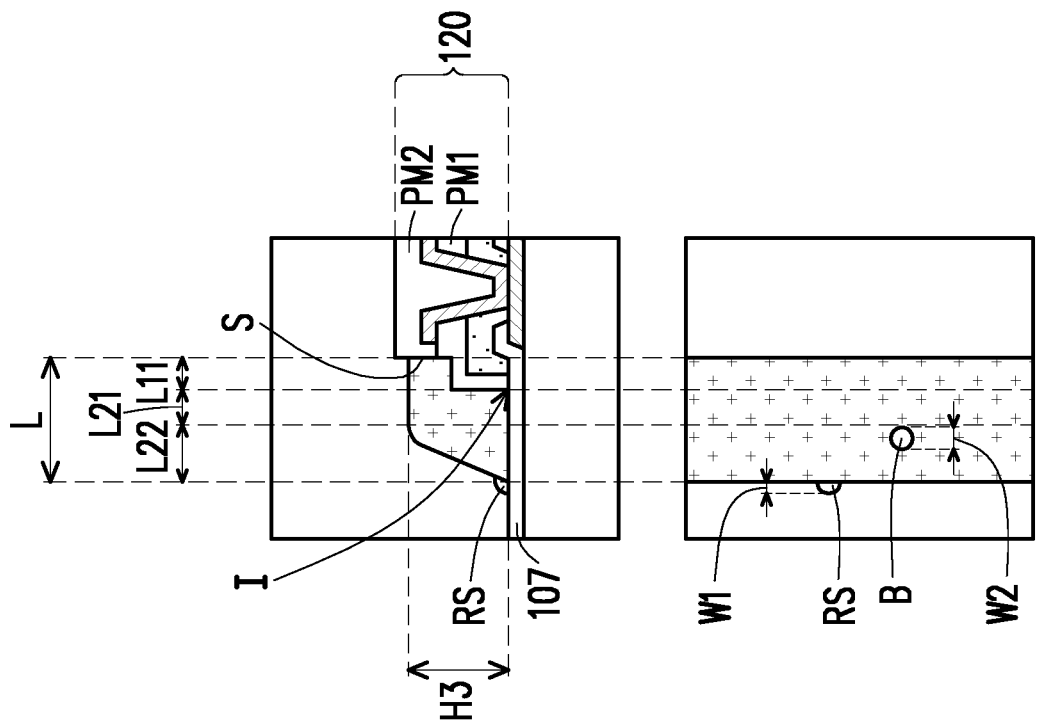
Figure 8F:
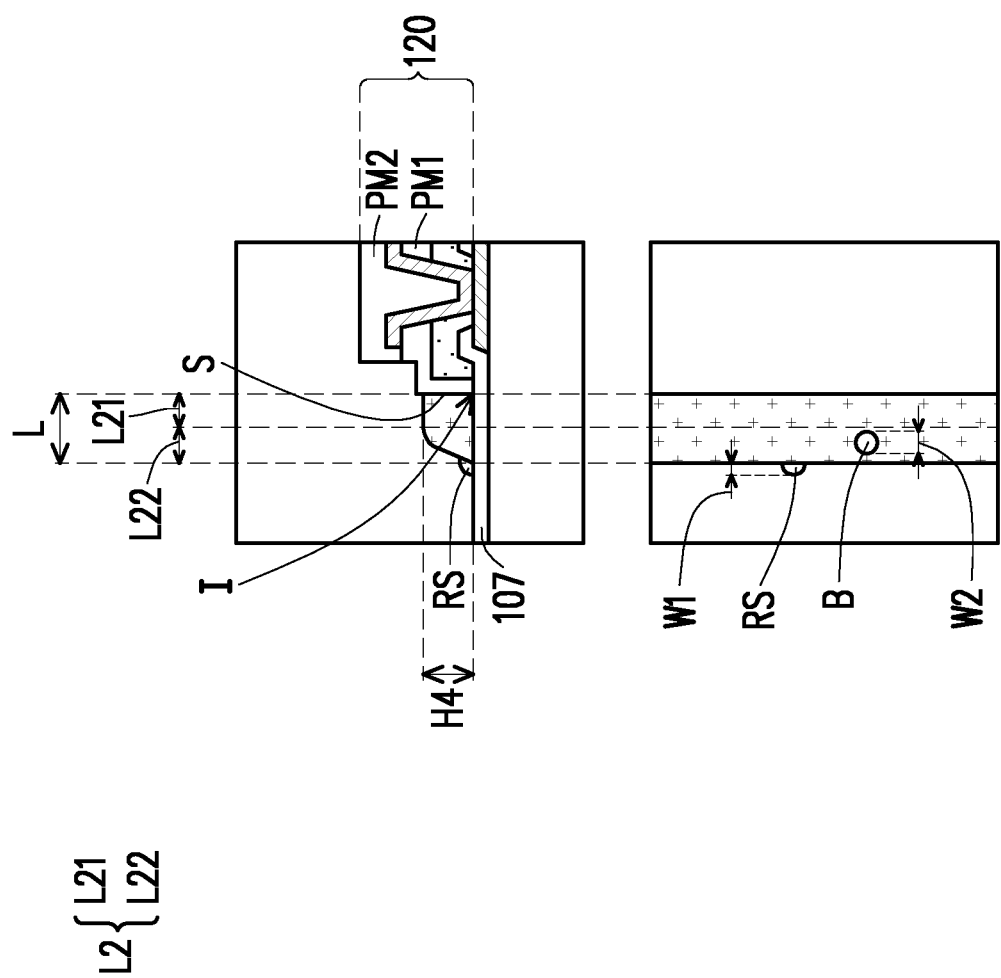

In the embodiment of FIG. 8C, the adhesive material A1 has a top surface higher than that of the redistribution layer structure. However, the disclosure is not limited thereto. In other embodiments, the top surface of the adhesive material A1 is substantially level with or less than the top surface of the redistribution layer structure, as shown in FIG. 8D to FIG. 8F. For example, the print amount of the adhesive material A1 in FIG. 7A may be tuned or adjusted for cost reduction. The cross-sectional shapes of the adhesive materials A1 in FIG. 8C to FIG. 8F are provided for illustration purposes, and are not construed as limiting the present disclosure. The cross-sectional shape of the adhesive material A1 is not limited by the disclosure, as long as the cured adhesive material A1 covers the interface I between the polymer layer PM1 and the passivation layer 107.

As shown in FIG. 8D and FIG. 8E, the adhesive material A1 is formed on the sidewall S of the redistribution layer structure 120 without extending onto the top of the redistribution layer structure 120. In some embodiments, the adhesive material A1 has an unsymmetrical sidewall profile. For example, the adhesive material A1 has a stepped sidewall close to the redistribution layer structure 120, an inclined sidewall away from the redistribution layer structure 120, and a mesa connecting the stepped sidewall and the inclined sidewall. Specifically, the adhesive material A1 not only covers the interface I between the polymer layer and the passivation layer 107, but covers one exposed polymer step of the redistribution layer structure 120. From another point of view, the adhesive material A1 has a curvy sidewall with multiple turning points close to the redistribution layer structure 120, and a substantially smooth sidewall away from the redistribution layer structure 120.

In some embodiments, as shown in FIG. 8D and FIG. 8E, the adhesive material A1 has a total width L of about 170-1000 um. In some embodiments, the total width L of the adhesive material A1 is divided into different types: a width L1 (e.g., extending width) on the polymer layer, and a width L2 on the passivation layer (including an extending width L21 and a bleeding width L22). For example, the width L1 on the polymer layer PM1 is about 30-250 um, the extending width L21 on the passivation layer 107 is about 50-250 um, the bleeding width L22 on the passivation layer 107 is about 70-250 um or less. In some embodiments, the distance (e.g., keep out zone) from the edge of the adhesive material A1 to the sensing regions 108 is at least about 50 um or more. In some embodiments, as shown in FIG. 8D, the adhesive material A1 has a total height H2 ranging from about 30 um to 90 um. In some embodiments, as shown in FIG. 8E, the adhesive material A1 has a total height H3 ranging from about 30 um to 80 um. In some embodiments, the top surface of the adhesive material A1 is substantially level with the top surface of the redistribution layer structure 120, as shown in FIG. 8D. In other embodiments, the top surface of the adhesive material A1 is less than the top surface of the redistribution layer structure 120, as shown in FIG. 8E.

In some embodiments, as shown in FIG. 8F, the adhesive material A1 is formed on the lower sidewall S of the redistribution layer structure 120. In some embodiments, the adhesive material A1 has an unsymmetrical sidewall profile. For example, the adhesive material A1 has a substantially vertical sidewall close to the redistribution layer structure 120, an inclined sidewall away from the redistribution layer structure 120, and a mesa connecting the substantially vertical sidewall and the inclined sidewall. Specifically, the adhesive material A1 merely covers the interface I between the polymer layer PM1 and the passivation layer 107, without covering any exposed polymer step of the redistribution layer structure 120. In some embodiments, as shown in FIG. 8F, the adhesive material A1 has a total width L of about 120-1000 um. In some embodiments, the total width L of the adhesive material A1 is the width L2 on the passivation layer (including an extending width L21 and a bleeding width L22). For example, the extending width L21 on the passivation layer 107 is about 50-250 um, the bleeding width L22 on the passivation layer 107 is about 70-250 um or less. In some embodiments, the distance (e.g., keep out zone) from the edge of the adhesive material A1 to the sensing regions 108 is at least about 50 um or more. In some embodiments, as shown in FIG. 8F, the adhesive material A1 has a total height H4 ranging from about 30 um to 70 um. The top surface of the adhesive material A1 is less than the top surface of the redistribution layer structure 120, as shown in FIG. 8F.

In some embodiments, as shown in FIG. 8C to FIG. 8F, the adhesive material A1 has a residue RS protruding from a sidewall and/or a top thereof. In some embodiments, the residue RS has a width W1 of about 1 to 20 um. In some embodiments, the adhesive material A1 has at least one void or bubble B therein. In some embodiments, the bubble B has a width W2 of about 1 to 20 um. The void or bubble may be in a vacuum state or filled with air or an inert gas. Multiple residues RS or bubbles B may be distributed randomly with different sizes.

Figure 9:
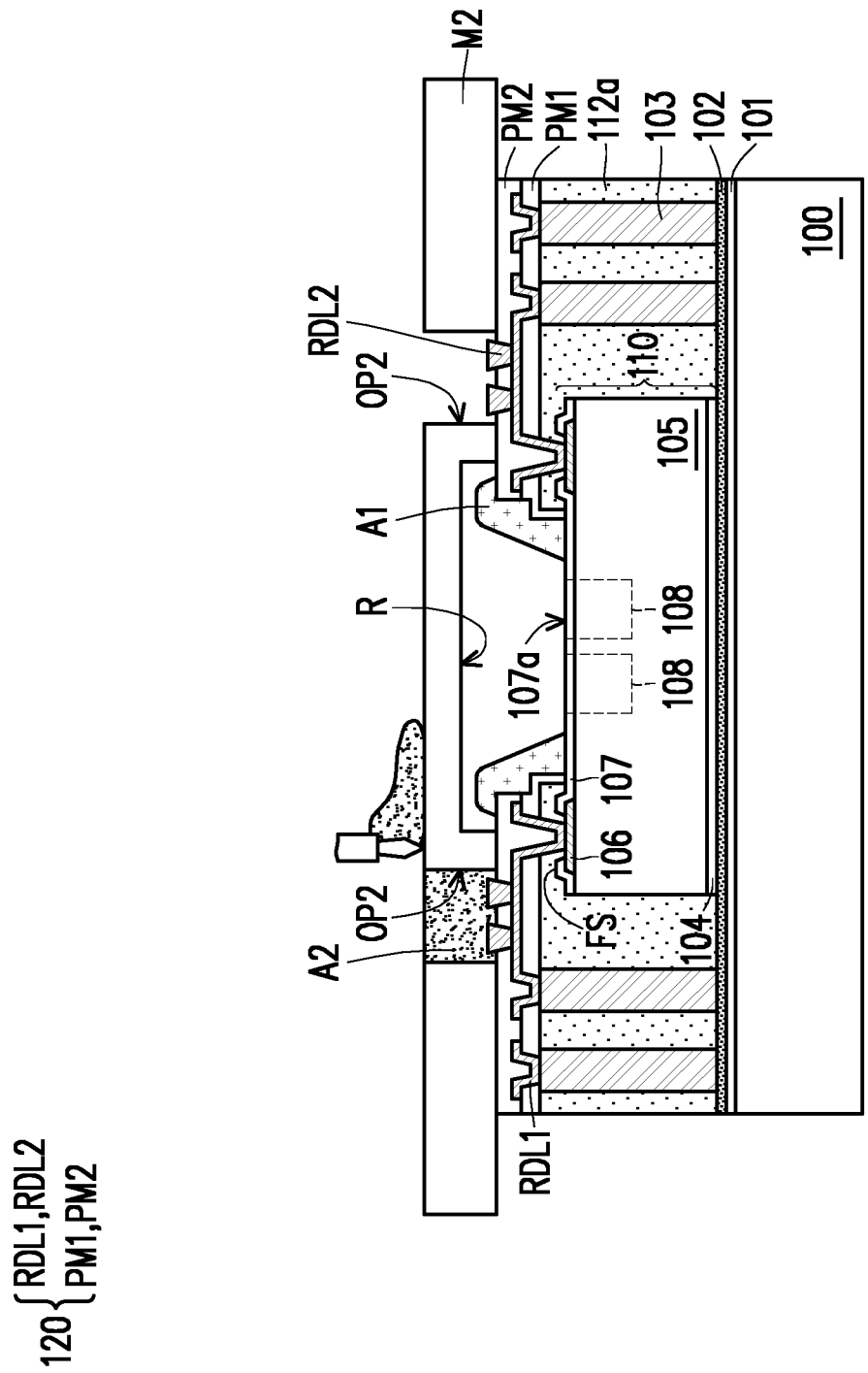

Referring to FIG. 9, an adhesive material A2 is applied onto the redistribution layer structure 120 around the exposed metal features (e.g., conductive vias or conductive pillars) of the redistribution layer RDL2.

In some embodiments, the adhesive material A2 includes a molding compound, a molding underfill, a resin (e.g., epoxy, silicone or both), or the like. In other embodiments, the adhesive material A2 includes a polymer material, such as polybenzoxazole (PBO), polyimide (PI), benzocyclobutene (BCB), or the like. In some embodiments, the adhesive material A2 is formed by a stencil printing process with a stencil mask M2 with openings OP2 corresponding to a location where the adhesive material A2 is to be printed. In some embodiments, when the previously formed adhesive material A1 is provided with a top surface higher than that of the redistribution layer structure 120, the stencil mask M2 is designed to have a recess R corresponding to a location where the adhesive material A1 is disposed. The recess R does not penetrate through the stencil mask M2. In other embodiments, when the adhesive material A1 is formed with a top surface no higher than that of the redistribution layer structure 120, the recess resign of the stencil mask M2 for the adhesive material A1 may be omitted.

In some embodiments, the printing process may be formed by the following processes: a stencil mask M2 is placed onto the redistribution layer structure 120. The stencil mask M2 has openings OP2 that expose the redistribution layer RDL2 and a portion of the polymer layer PM2 adjacent to the redistribution layer RDL2. The printing process is performed using the stencil mask M2, such that the adhesive material A2 is applied or printed on the redistribution layer RDL2 exposed by the openings OP2 of the stencil mask M2. In some embodiments, the adhesive material A2 is different from the adhesive material A1. In some embodiments, the flowability of the adhesive material A2 is greater than the flowability of the adhesive material A1. In some embodiments, the viscosity of the adhesive material A2 is less than the viscosity of the adhesive material A1.

Figure 10:
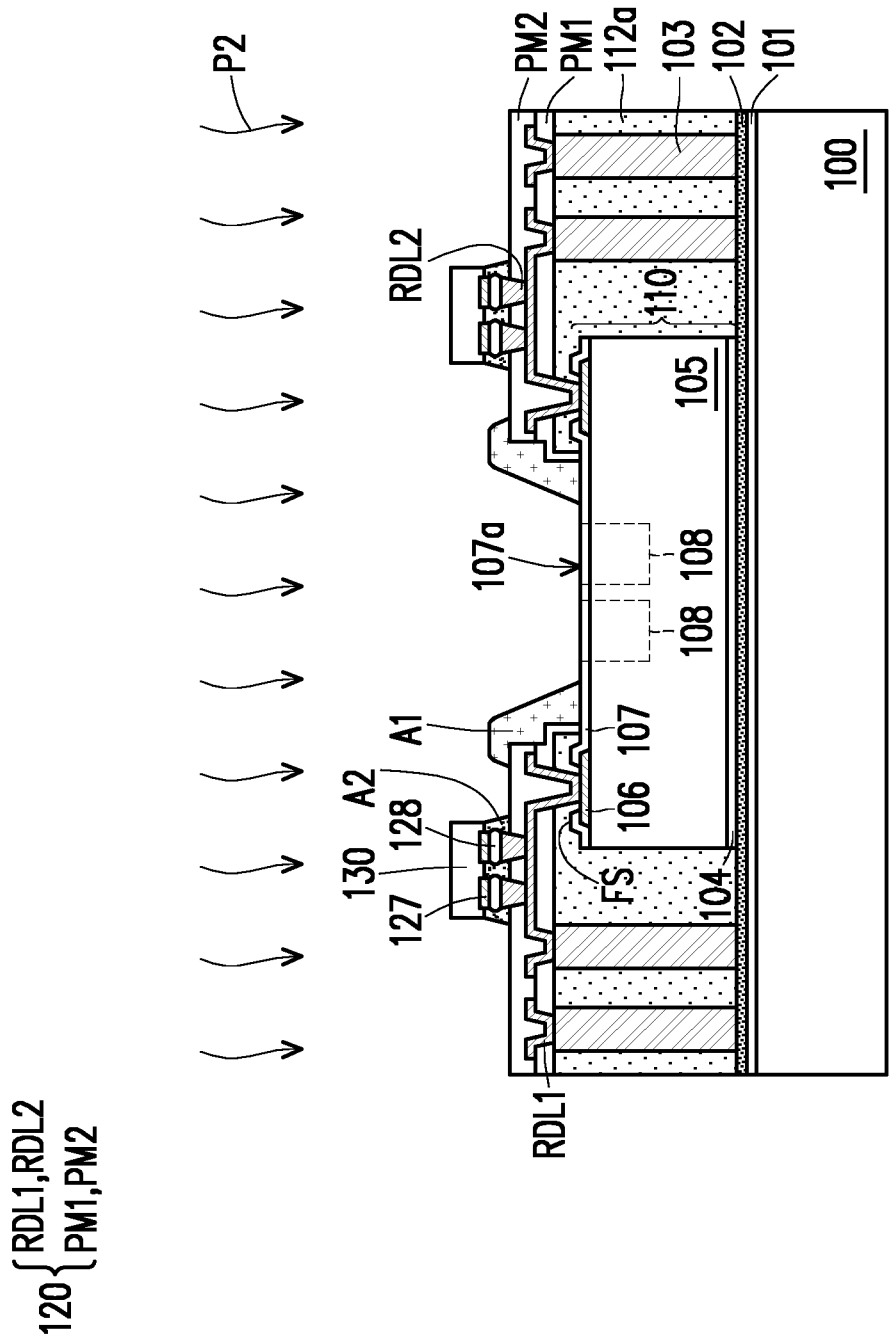

Referring to FIG. 10, integrated passive devices 130 are electrically bonded to metal features of the redistribution layer RDL2 of the redistribution layer structure 120. The integrated passive devices 130 are further electrically coupled to the die 110 through the redistribution layer structure 120. Each integrated passive device 130 may be an integrated passive device (IPD), a surface mount device (SMD), the like, or a combination thereof, but the disclosure is not limited thereto. In some embodiments, each integrated passive device 130 includes connectors 128 electrically connected to conductive pads 127 thereof. The conductive pads 127 may include metal, such as aluminum, copper, an alloy thereof, or any other suitable metallic material. The connectors 128 may be solder bumps, solder balls or other suitable metallic connectors. In some embodiments, the connectors 128 may also be referred to as conductive terminals of the integrated passive device 130. The connectors 128 are electrically bonded to the redistribution layer RDL2.

In some embodiments, the mounting of the integrated passive devices 130 includes: placing the integrated passive device 130 onto the redistribution layer RDL2, and the adhesive material A2 may be pushed outward to surround the connectors 128 and/or the conductive pads 127 of the integrated passive device 130 and the redistribution layer RDL2. Thereafter, a reflow process P2 is performed. In some embodiments, the reflow process P2 is performed at a temperature of about 200° C. to 300° C. for about 5 minutes to 15 minutes. During the reflow process, a portion of the adhesive material A2 is reacted with connectors 128 to facilitate the bonding process, and the other portion of the adhesive material A2 is unreacted and remained as a filling layer. The adhesive material A2 is referred to a "flux material", "filling layer" or "underfill layer" in some examples.

As shown in FIG. 10, the adhesive material A2 is configured to fill the space between the integrated passive device 13, laterally surround the connectors 128 and/or the conductive pads 127 of the integrated passive device 130, and may further laterally surround a portion of the redistribution layer RDL2 of the redistribution layer structure 120.

Figure 11:
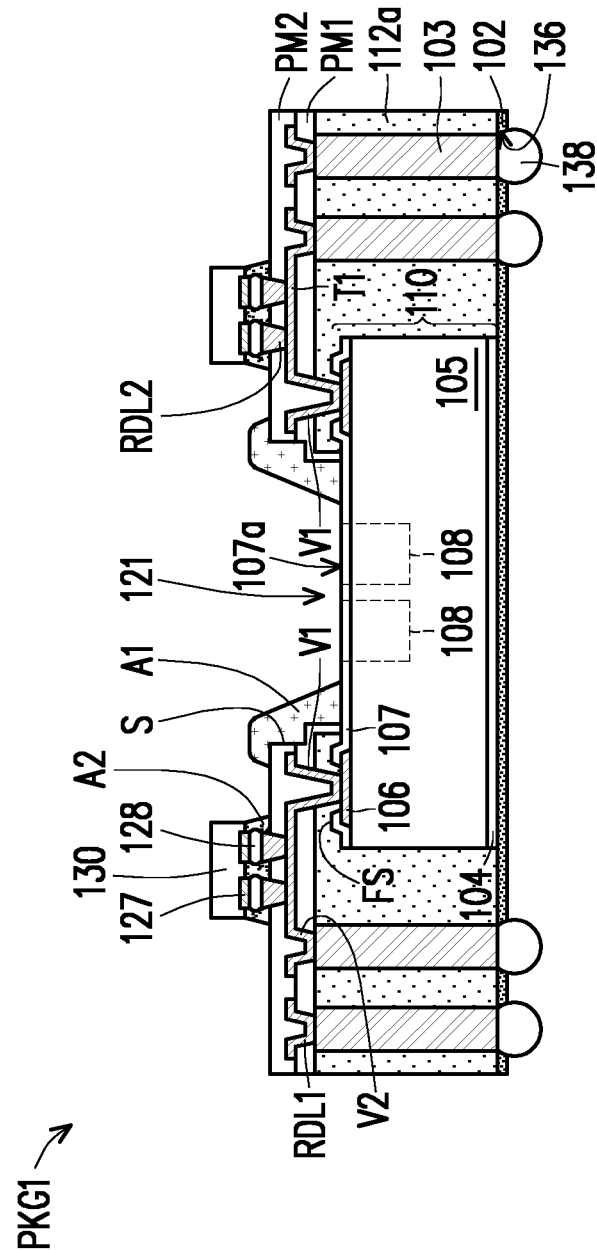

Referring to FIG. 11, the carrier 100 is de-bonded from the backside of the structure of FIG. 10. In some embodiments, the de-bonding layer 101 is decomposed under heat of light, and the carrier 100 is then released from the structure formed thereon.

Thereafter, the dielectric layer 102 is patterned such that openings 136 are formed to expose the bottom surfaces of the conductive vias 103. In some embodiments, the number of the openings 136 corresponds to the number of the conductive vias 103. In some embodiments, the openings of the dielectric layer 102 are formed by a laser drilling process or another suitable patterning process.

In some embodiments, a plasma cleaning process may be performed to the openings 136 of the dielectric layer 102, and connectors 138 are formed on the dielectric layer 102 and fill into the openings 136 to electrically connect to the conductive vias 103. The connectors 138 may be conductive balls, micro bumps, or the like, or combinations thereof. In some embodiments, the connectors 138 are solder balls formed by a suitable technique, such as ball mounting process, or a printing process followed by a reflow process. The connectors 138 are electrically connected to the die 110 through the conductive vias 103 and the redistribution layer structure 120. A package structure PKG1 is thus formed at this stage.

In some embodiments, another package including a device (e.g., memory device, logic device or another suitable semiconductor device) or a board (e.g., printed circuit board) is provided and bonded to the package structure PKG1 through the connectors 138.

FIG. 14 illustrates a cross-sectional view of a package structure according to other embodiments of the disclosure. The present embodiment is similar to the foregoing embodiment in FIG. 11, except that the encapsulation layer 112a does not cover the first surface FS of the die 110.

Referring to FIG. 14, as described above in FIG. 11, in some embodiments, the sacrificial layer 109 may be formed to cover the entire surface of the passivation layer 107 and the conductive pads 106 of the die 110, and the encapsulation layer 112a may be formed laterally aside the die 110 without covering the first surface FS of the die 110. In such an embodiment, the redistribution layer structure 120 is accordingly formed to cover a portion of the first surface FS the die 110 and laterally surrounded by the encapsulation layer 112a. For example, a portion of the polymer layer PM1 is formed to cover and physically contact the conductive pads 106 and a portion of the passivation layer 107. The conductive vias V1 may merely penetrate through the polymer layer PM1 to connect to the conductive pads 106. The other features of the package structure PKG2 are substantially the same as those of the package structure PKG1 described in FIG. 11, which are not described again here.

In the above embodiments, the interface sealing structure (e.g., adhesive material A1) and the underfill layer (e.g., adhesive material A2) are performed separately with different materials by two printing processes. However, the disclosure is not limited thereto. In other embodiments, the interface sealing protection structure and the unerfill layer can be formed with the same material by a single printing process.

Figure 15:
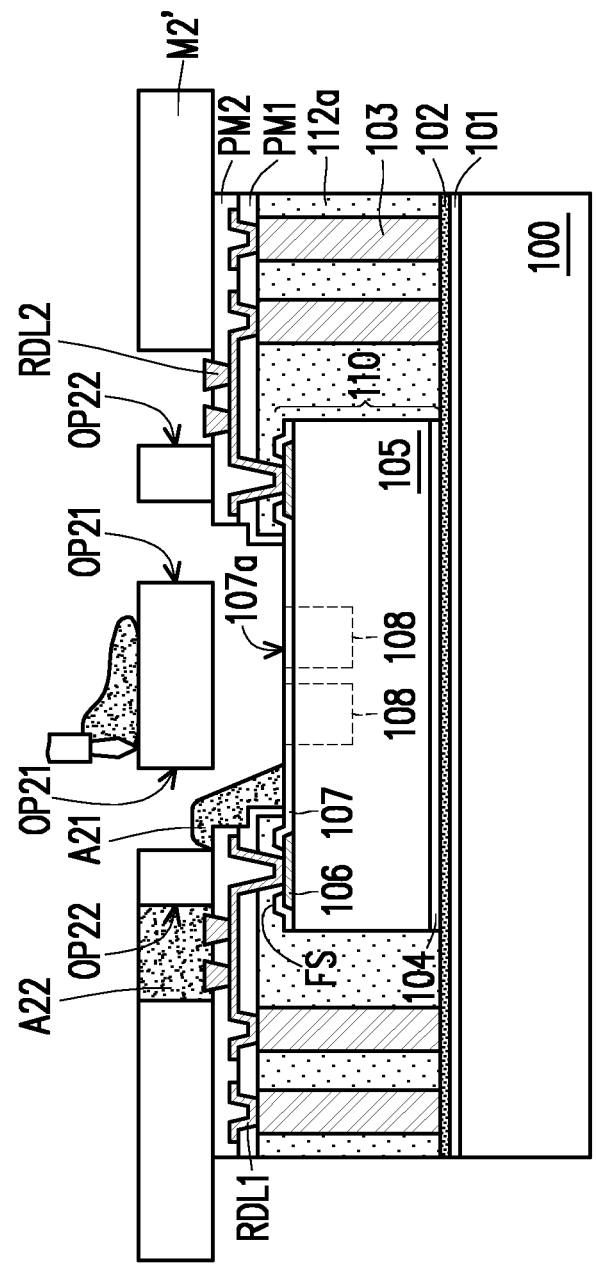
FIGS. 15 to 17 illustrate schematic cross-sectional views of manufacturing a package structure in accordance with other embodiments of the disclosure.
Figure 16:
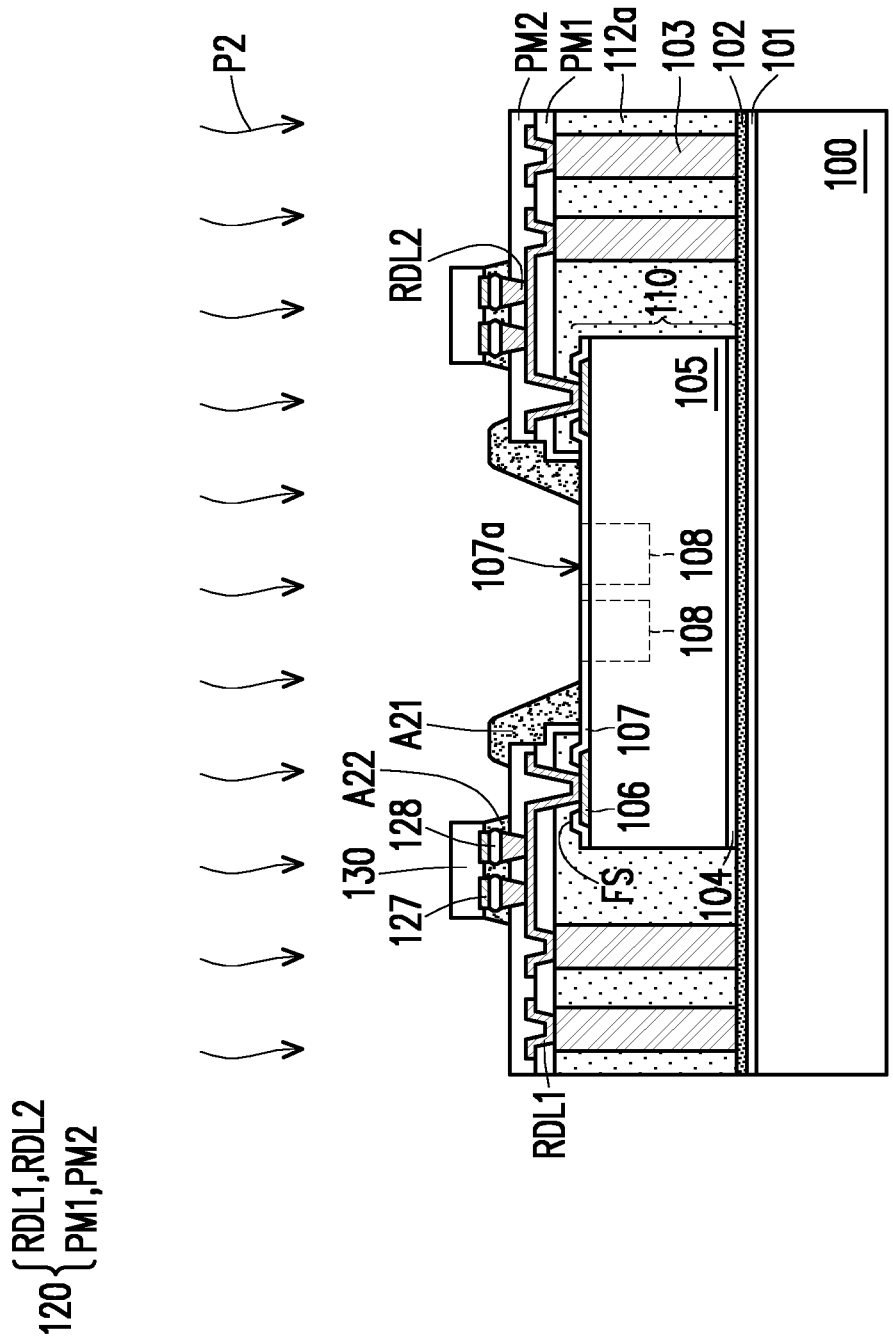
Figure 17:
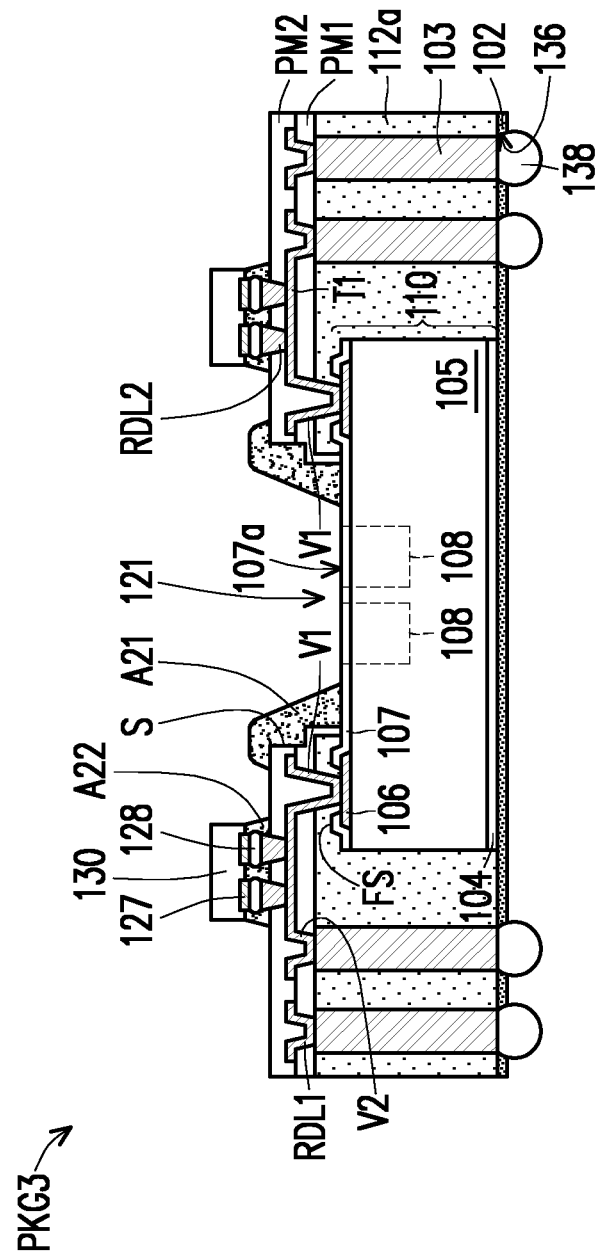

FIGS. 15 to 17 illustrate schematic cross-sectional views of manufacturing a package structure in accordance with other embodiments of the disclosure.

In some embodiments, after the operations of FIG. 1 to FIG. 6B are implemented, as shown in FIG. 15 to FIG. 16, an adhesive material A21 is applied onto the redistribution layer structure 120 around the interface I between the polymer layer PM1 and the passivation layer 107, and an adhesive material A22 is applied onto the redistribution layer structure 120 around the exposed metal features (e.g., conductive vias or conductive pillars) of the redistribution layer RDL2.

In some embodiments, the adhesive materials A21 and A22 are formed of the same material by the same printing process. In some embodiments, each of the adhesive materials A21 and A22 includes a molding compound, a molding underfill, a resin (e.g., epoxy, silicone or both), or the like. In other embodiments, the adhesive material A1 includes a polymer material, such as polybenzoxazole (PBO), polyimide (PI), benzocyclobutene (BCB), or the like. In some embodiments, an adhesive material A21 is formed by a stencil printing process with a stencil mask M2' with openings OP21 corresponding to a location where the adhesive material A21 is to be printed, and an adhesive material A22 is formed by the same stencil printing process with the same stencil mask M2' with openings OP22 corresponding to a location where the adhesive material A22 is to be printed.

In some embodiments, a printing process may be formed by the following processes: a stencil mask M2' is placed onto the redistribution layer structure 120. The stencil mask M2' has openings OP21 that expose the interface I between the polymer layer PM1 and the passivation layer 107, and openings OP21 that expose the redistribution layer RDL2 and a portion of the polymer layer PM2 adjacent to the redistribution layer RDL2. The printing process is performed using the stencil mask M2', such that the adhesive material A21 is applied or printed at the interface I between the polymer layer PM1 and the passivation layer 107 exposed by the openings OP21 of the stencil mask M2', and the adhesive material A22 is applied or printed on the redistribution layer RDL2 exposed by the openings OP22 of the stencil mask M2'.

Referring to FIG. 16, the mounting of the integrated passive devices 130 includes placing the integrated passive device 130 onto the redistribution layer RDL2, and the adhesive material A2 may be pushed outward to surround the connectors 128 and/or the conductive pads 127 of the integrated passive device 130 and the redistribution layer RDL2. Thereafter, a reflow process P2 is performed. In some embodiments, the reflow process P2 is performed at a temperature of about 200° C. to 300° C. for about 5 minutes to 15 minutes. During the reflow process, the adhesive material A22 is hardened to serve as a sealing protection structure at the interface between the polymer layer PM1 and the passivation layer 107, a portion of the adhesive material A22 is reacted with connectors 128 to facilitate the bonding process, and the other portion of the adhesive material A22 is unreacted and remained as a filling layer.

Referring to FIG. 17, the operation similar to the operation in FIG. 11 is implemented, so as to form a package structure PKG3.

Figure 18:
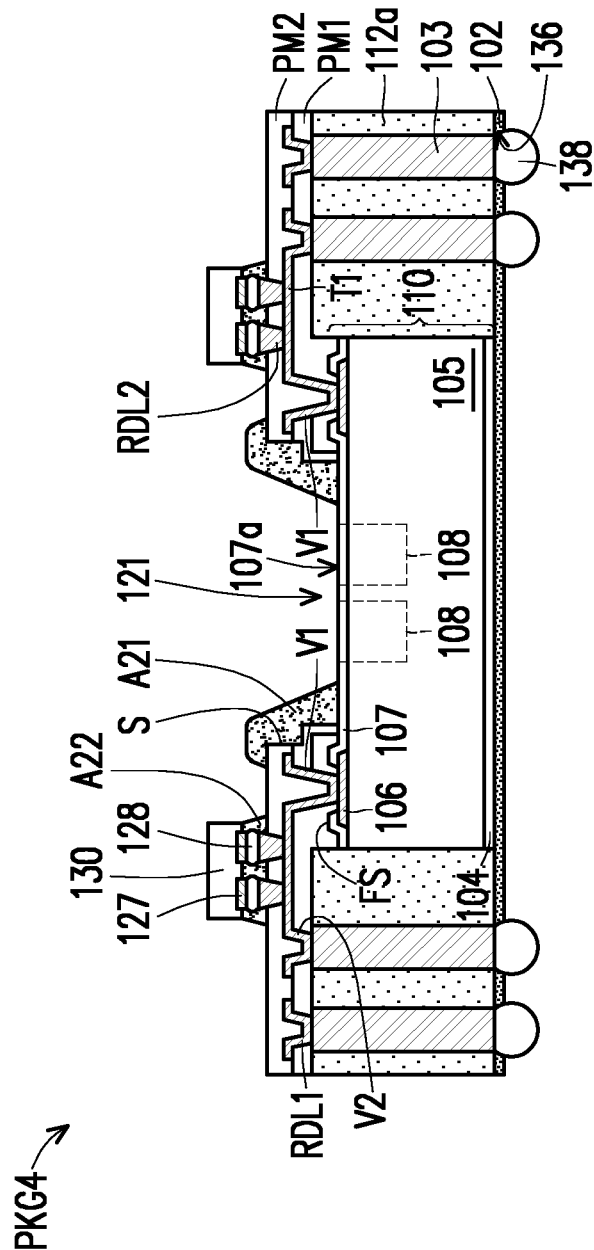
FIG. 18 illustrates a schematic cross-sectional view of a package structure in accordance with other embodiments of the disclosure.

FIG. 18 illustrates a cross-sectional view of a package structure PKG4 according to other embodiments of the disclosure. The present embodiment is similar to the foregoing embodiment in FIG. 17, except that the encapsulation layer 112a does not cover the first surface FS of the die 110.

In some embodiments, the adhesive material A21 in FIGS. 17-18 has a top surface higher than that of the top surface of the redistribution layer structure 120, but the disclosure is not limited thereto. The adhesive material A21 in FIGS. 17-18 may have a top surface equal to or less than that of the top surface of the redistribution layer structure 120, and the profiles of adhesive material A21 are similar to those described in FIG. 8D to FIG. 8F. Besides, the adhesive material A21 may have at least one bubble and/or at least one residue, similar to those described in FIG. 8C to FIG. 8F. Besides, the adhesive material A21 has an enclosed shape in a top view, similar to the adhesive material A1 described in FIG. 8B.

Figure 19:
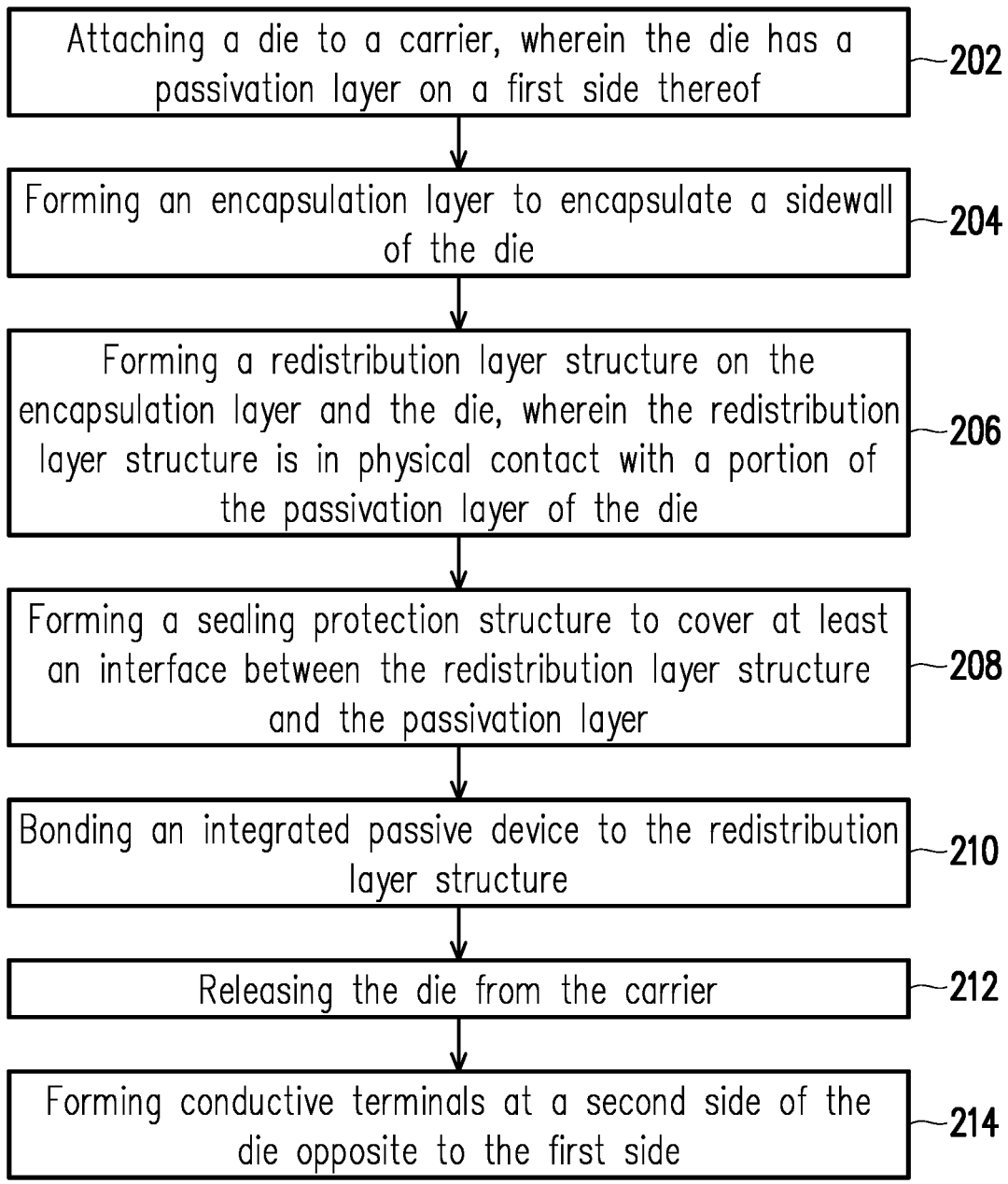
FIG. 19 illustrates a method of forming a package structure in accordance with some embodiments of the disclosure.

FIG. 19 illustrates a method of forming a package structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 202, a die is attached to a carrier, wherein the die has a passivation layer on a first side thereof. FIG. 1 to FIG. 2 illustrate varying views corresponding to some embodiments of act 202.

At act 204, an encapsulation layer is formed to encapsulate a sidewall of the die. FIG. 3 to FIG. 5 illustrate varying views corresponding to some embodiments of act 204.

At act 206, a redistribution layer structure is formed on the encapsulation layer and the die, wherein the redistribution layer structure is in physical contact with a portion of the passivation layer of the die. FIG. 6A to FIG. 6B illustrate varying views corresponding to some embodiments of act 206.

At act 208, a sealing protection structure is formed to cover at least an interface between the redistribution layer structure and the passivation layer. FIG. 7A to FIG. 8F illustrate varying views corresponding to some embodiments of act 208.

In some embodiments, a method (e.g., the method shown in FIG. 7A to FIG. 8F) of forming the sealing protection structure includes performing a stencil printing process and a screen printing process. In some embodiments, the method further includes, after performing the stencil printing process or the screen printing process, performing a curing process at a temperature of 120° C. to 150° C. for about 1 hour to 2 hours.

In other embodiments, a method (e.g., the method shown in FIG. 15 to FIG. 16) of forming the sealing protection structure includes performing a stencil printing process. In some embodiments, the method further includes, after performing the stencil printing process, performing a reflow process at a temperature of 200° C. to 300° C. for about 5 minutes to 15 minutes.

At act 210, an integrated passive device is bonded to the redistribution layer structure. FIG. 9 to FIG. 10 and FIG. 16 illustrate varying views corresponding to some embodiments of act 210.

At act 212, the die is released from the carrier. FIG. 11 and FIG. 17 illustrate cross-sectional views corresponding to some embodiments of act 212.

At act 214, conductive terminals are formed at a second side of the die opposite to the first side. FIG. 11 and FIG. 17 illustrate cross-sectional views corresponding to some embodiments of act 214.

The structures of the disclosure are described below with reference to FIG. 1 to FIG. 18.

In some embodiments, as shown in FIG. 11, FIG. 14, FIG. 17 and FIG. 18, a package structure PKG1/PKG2/PKG3/PKG4 includes a die 110, an encapsulation layer 112a, a redistribution layer structure 120 and an adhesive material A1/A21. The die 110 includes a semiconductor substrate 105, conductive pads 106 disposed over the semiconductor substrate 105 and a passivation layer 107 disposed over the semiconductor substrate 105 and around the conductive pads 106. The encapsulation layer 112a laterally encapsulates the die 110. The redistribution layer structure 120 is disposed on the die 110 and the encapsulation layer 112a, and includes at least one redistribution layer RDL1/RDL2 embedded in at least one polymer layer PM1/PM2, and the polymer layer PM1 contacts a portion of the passivation layer 107. The adhesive material A1/A21 is disposed on the die 110 and covers an interface I between the polymer layer PM1 and the passivation layer 107.

In some embodiments, the adhesive material A1 has an enclosed shape in a top view, as shown in FIG. 8B.

In some embodiments, the die 110 has at least one sensing region 108 extending from a top surface 107a of the passivation layer 107 to the semiconductor substrate 105, and the adhesive material A1/A21 is separated from the at least one sensing region 108 by a non-zero horizontal distance In some embodiments, a top surface of the adhesive material is higher than a top surface of the redistribution layer structure, as shown in FIG. 8C. In some embodiments, a top surface of the adhesive material is substantially level with a top surface of the redistribution layer structure, as shown in FIG. 8D. In some embodiments, a top surface of the adhesive material is lower than a top surface of the redistribution layer structure, as shown in FIG. 8E and FIG. 8F.

In some embodiments, the adhesive material A1/A21 has at least one residue RS protruding from a sidewall or a top surface thereof. In some embodiments, the adhesive material A1/A21 has at least one void or bubble B therein.

In some embodiments, the package structure PKG1/PKG2/PKG3/PKG4 further includes an integrated passive device 130 disposed on and electrically bonded to the redistribution layer structure 120.

In some embodiments, the encapsulation layer 112a extends onto a portion of the passivation layer 107. In some embodiments, the vias V1 of the redistribution layer structure 120 penetrate through the encapsulation layer 112a and are electrically connected to the conductive pads 106 of the die 110.

In some embodiments, as shown in FIG. 11, FIG. 14, FIG. 17 and FIG. 18, a package structure PKG1/PKG2/PKG3/PKG4 includes a die 110, an encapsulation layer 112a, a redistribution layer structure 120 and a sealing protection structure (e.g., adhesive material A1/A21). The die 110 has a first surface FS. The encapsulation layer 112a encapsulates a sidewall of the die 110. the redistribution layer structure 120 is disposed on the encapsulation layer 112a and defines an opening 121 that exposes a portion of the first surface of the die 110. The sealing protection structure (e.g., adhesive material A1/A21) is disposed on the die 110 and along a sidewall S of the opening 121 defined by the redistribution layer structure 120.

In some embodiments, the sealing protection structure includes epoxy, silicone or epoxy-silicone hybrid resin. For example, the adhesive material A1 may be epoxy-silicone hybrid resin. For example, the adhesive material A21 may be epoxy.

In some embodiments, the package structure PKG1/PKG2/PKG3/PKG4 further includes an integrated passive device 130 disposed on and electrically bonded to the redistribution layer structure 120. In some embodiments, a filling layer (e.g., adhesive material A2/A22) is disposed to fill a space between the integrated passive device 130 and the redistribution layer structure 120, and the filling layer laterally surrounds a connector 128 of the integrated passive device 130 and a conductive pillar (e.g., RDL2) of the redistribution layer structure 120.

In some embodiments, an edge of the encapsulation layer 112a is aligned with the sidewall of the die 110, as shown in FIG. 14 and FIG. 18.

In some embodiments, the sealing protection structure (e.g., adhesive material A2/A22) has a stepped sidewall close to the redistribution layer structure 120, an inclined sidewall away from the redistribution layer structure 120, as shown in FIG. 8C and FIG. 8E.

In some embodiments of the disclosure, an adhesive material is configured to provide sealing protection for the interface between two different materials (e.g., between the polymer layer and the passivation layer), so as to prevent the film delamination issue and therefore improve the reliability of the device. The adhesive material may be one or mix of several kinds of polymer. In some embodiments, the adhesive material may be an epoxy-silicone hybrid resin. In other embodiments, the adhesive material may be an epoxy resin. Other polymer may be used instead of the epoxy-based adhesive material. In some embodiments, one of two different materials includes silicon nitride, silicon, silicon carbide, or the like, and the other of the two different materials includes low-temperature polyimide (LTPI), solder mask, or the like.

In accordance with some embodiments of the disclosure, a package structure includes a die, an encapsulation layer, a redistribution layer structure and an adhesive material. The die includes a semiconductor substrate, conductive pads disposed over the semiconductor substrate and a passivation layer disposed over the semiconductor substrate and around the conductive pads. The encapsulation layer laterally encapsulates the die. the redistribution layer structure is disposed on the die and the encapsulation layer, and includes at least one redistribution layer embedded in at least one polymer layer, and the polymer layer contacts a portion of the passivation layer. The adhesive material is disposed on the die and covers an interface between the polymer layer and the passivation layer.

In accordance with other embodiments of the disclosure, a package structure includes a die, an encapsulation layer, a redistribution layer structure and a sealing protection structure. The die has a first surface. The encapsulation layer encapsulates a sidewall of the die. the redistribution layer structure is disposed on the encapsulation layer and defines an opening that exposes a portion of the first surface of the die. The sealing protection structure is disposed on the die and along a sidewall of the opening defined by the redistribution layer structure.

In accordance with some embodiments of the disclosure, a method of forming a package structure includes: attaching a die to a carrier, wherein the die has a passivation layer on a first side thereof; forming an encapsulation layer to encapsulate a sidewall of the die; forming a redistribution layer structure on the encapsulation layer and the die, wherein the redistribution layer structure is in physical contact with a portion of the passivation layer of the die; and forming a sealing protection structure to cover at least an interface between the redistribution layer structure and the passivation layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    a die, comprising a semiconductor substrate, conductive pads disposed over the semiconductor substrate and a passivation layer disposed over the semiconductor substrate and around the conductive pads;
    an encapsulation layer, laterally encapsulating the die;
    a redistribution layer structure, disposed on the die and the encapsulation layer, and comprising at least one redistribution layer embedded in at least one polymer layer, wherein the polymer layer contacts a portion of the passivation layer; and
    an adhesive material, disposed on the die and covering an interface between the polymer layer and the passivation layer,
    wherein the adhesive material has an enclosed shape from a top view, and
    wherein the encapsulation layer extends to contact portions of the conductive pads.

2. The package structure of claim 1, wherein the enclosed shape comprises a rectangular ring shape or a circular ring shape.

3. The package structure of claim 1, wherein the die has at least one sensing region extending from a top surface of the passivation layer to the semiconductor substrate, and the adhesive material is separated from the at least one sensing region by a non-zero horizontal distance.

4. The package structure of claim 1, wherein the adhesive material is in direct contact with the interface between the polymer layer and the passivation layer.

5. The package structure of claim 1, wherein a top surface of the adhesive material is higher than a top surface of the redistribution layer structure.

6. The package structure of claim 1, wherein the adhesive material has at least one residue protruding from a sidewall thereof.

7. The package structure of claim 1, wherein the adhesive material has at least one void or bubble therein.

8. The package structure of claim 1, further comprising an integrated passive device disposed on and electrically bonded to the redistribution layer structure, wherein a top surface of the adhesive material is higher than a top surface of the redistribution layer structure and is separated from the integrated passive device.

9. The package structure of claim 1, wherein the encapsulation layer extends onto a portion of the passivation layer.

10. The package structure of claim 9, wherein vias of the redistribution layer structure penetrate through the encapsulation layer and are electrically connected to the conductive pads of the die.

11. A package structure, comprising:
    a die, comprising a semiconductor substrate, conductive pads disposed over the semiconductor substrate and a passivation layer disposed over the semiconductor substrate and around the conductive pads;
    an encapsulation layer, encapsulating a sidewall of the die;
    a redistribution layer structure, disposed on the encapsulation layer and defining an opening that exposes a portion of the passivation layer; and
    a sealing protection structure, disposed on the die and along a sidewall of the opening defined by the redistribution layer structure,
    wherein the sealing protection structure has an enclosed shape from a top view
    wherein the encapsulation layer extends to contact portions of the conductive pads.

12. The package structure of claim 11, wherein the sealing protection structure comprises epoxy, silicone or epoxy-silicone hybrid resin.

13. The package structure of claim 11, further comprising an integrated passive device disposed on and electrically bonded to the redistribution layer structure, wherein a top surface of the adhesive material is higher than a top surface of the redistribution layer structure and is separated from the integrated passive device.

14. The package structure of claim 13, further comprising a filling layer disposed to fill a space between the integrated passive device and the redistribution layer structure, wherein the filling layer laterally surrounds a connector of the integrated passive device and a conductive pillar of the redistribution layer structure.

15. The package structure of claim 11, wherein the encapsulation layer extends onto and is in contact with a portion of the passivation layer.

16. The package structure of claim 11, wherein the sealing protection structure has a stepped sidewall close to the redistribution layer structure and an inclined sidewall away from the redistribution layer structure, and the stepped sidewall is opposite to the inclined sidewall.

17. A package structure, comprising:
   a die, comprising a semiconductor substrate, conductive pads disposed over the semiconductor substrate and a passivation layer disposed over the semiconductor substrate and around the conductive pads;
   an encapsulation layer, laterally encapsulating the die, extending onto and in contact with a portion of the passivation layer and portions of the conductive pads;
   a redistribution layer structure, disposed on the die and the encapsulation layer, and comprising at least one redistribution layer embedded in at least one polymer layer, wherein the polymer layer contacts a portion of the passivation layer; and
   an adhesive material, disposed on the die and covering an interface between the polymer layer and the passivation layer,
   wherein the adhesive material has an enclosed shape from a top view, and
   wherein the encapsulation layer extends to contact portions of the conductive pads.

18. The package structure of claim 17, wherein a top surface of the adhesive material is in direct with the interface between the polymer layer and the passivation layer.

19. The package structure of claim 17, wherein a top surface of the adhesive material is higher than a top surface of the redistribution layer structure.

20. The package structure of claim 17, wherein the adhesive material has at least one void or bubble therein.

* * * * *